United States Patent
Tsai et al.

(10) Patent No.: US 9,991,198 B2
(45) Date of Patent: Jun. 5, 2018

(54) LAYOUT METHOD FOR COMPOUND SEMICONDUCTOR INTEGRATED CIRCUITS

(71) Applicant: WIN Semiconductors Corp., Tao Yuan (TW)

(72) Inventors: Shu-Hsiao Tsai, Tao Yuan (TW); Rong-Hao Syu, Tao Yuan (TW); Yi-Ling Liu, Tao Yuan (TW); Cheng-Kuo Lin, Tao Yuan (TW)

(73) Assignee: WIN SEMICONDUCTORS CORP., Taoyuan (TW)

( * ) Notice: Subject to any disclaimer, the term of this patent is extended or adjusted under 35 U.S.C. 154(b) by 0 days. days.

(21) Appl. No.: 15/066,556

(22) Filed: Mar. 10, 2016

(65) Prior Publication Data

US 2017/0110400 A1    Apr. 20, 2017

(30) Foreign Application Priority Data

Oct. 19, 2015 (TW) .............................. 104134237 A

(51) Int. Cl.
*H01L 21/762* (2006.01)
*H01L 23/522* (2006.01)
*H01L 23/00* (2006.01)
*H01L 29/73* (2006.01)
*H01L 29/423* (2006.01)
(Continued)

(52) U.S. Cl.
CPC ........ *H01L 23/5221* (2013.01); *H01L 21/762* (2013.01); *H01L 23/564* (2013.01); *H01L 29/0692* (2013.01); *H01L 29/42304* (2013.01); *H01L 29/66242* (2013.01); *H01L 29/73* (2013.01); *H01L 29/737* (2013.01); *H01L 29/7371* (2013.01); *H01L 27/0207* (2013.01); *H01L 27/0823* (2013.01)

(58) Field of Classification Search
None
See application file for complete search history.

(56) References Cited

U.S. PATENT DOCUMENTS

| 6,136,683 | A | * | 10/2000 | Saito | .................... H01L 21/7682 257/E21.581 |
| 2003/0139513 | A1 | * | 7/2003 | Hsu | .......................... B29D 7/01 524/445 |

(Continued)

*Primary Examiner* — Jay C Chang
(74) *Attorney, Agent, or Firm* — Muncy, Geissler, Olds & Lowe, P.C.

(57) ABSTRACT

A layout method for compound semiconductor integrated circuits, comprising following steps of: forming a first metal layer within a first circuit layout area which intersects with a second circuit layout area at an intersection area on a compound semiconductor substrate; defining an adjacent crossover area including said intersection area and a peripheral adjacent area thereof; a first dielectric area located within said adjacent crossover area and intersected with at least part of said intersection area; forming a first dielectric block within said first dielectric area or forming said first dielectric block within said first dielectric area and a second dielectric block outside said first dielectric area, the thickness of said second dielectric block is no greater than and the thickness of at least part of said second dielectric block is smaller than the thickness of said first dielectric block; forming a second metal layer within said second circuit layout area.

30 Claims, 26 Drawing Sheets

(51) Int. Cl.
 H01L 29/66 (2006.01)
 H01L 29/737 (2006.01)
 H01L 29/06 (2006.01)
 H01L 27/02 (2006.01)
 H01L 27/082 (2006.01)

(56) References Cited

U.S. PATENT DOCUMENTS

2010/0156559 A1\* 6/2010 Wang ................... H01P 1/184
 333/161
2014/0042642 A1\* 2/2014 Chen .................. H01L 23/5283
 257/775

\* cited by examiner

LAYOUT METHOD FOR COMPOUND SEMICONDUCTOR INTEGRATED CIRCUITS

FIELD OF THE INVENTION

The present invention relates to a layout method for compound semiconductor integrated circuits, especially to a layout method for compound semiconductor integrated circuits with enhanced moisture resistance ability for the compound semiconductor integrated circuits.

BACKGROUND OF THE INVENTION

In the compound semiconductor integrated circuits, when two metal layers having different potentials is required to cross-connect, the area of the cross-connection between two metal layers requires good isolation. Conventional technology forms an isolation layer made of polyimide to isolate the cross-connection of two metal layers having different potentials. Usually an isolation layer of polyimide is firstly formed on a bottom metal layer, and then forming a top metal layer on the polyimide isolation layer, wherein the bottom metal layer and the top metal layer are two metal layers having different potentials. However, the polyimide isolation layer is needed only in the intersection area and the adjacent area of the cross-connection of the bottom metal layer and the top layer. There is no need of the polyimide isolation layer in other area. The polyimide isolation layer usually will not be removed by etching in convention technology. Hence, the polyimide isolation layer is not only existing in the intersection area of the cross-connection of the bottom metal layer and the top layer, but also existing in other area where it does not need the polyimide isolation layer.

However, since the polyimide itself has such a rate of water absorption that the existence of the polyimide isolation layer will seriously affect the moisture resistance ability of the compound semiconductor integrated circuit. The polyimide isolation layer in the intersection area of the cross-connection of the bottom metal layer and the top layer is needed for isolating the two layers having different potentials, the bottom metal layer and the top layer. But the existence of the polyimide isolation layer in other wide area where does not need the polyimide isolation layer is the main reason that reduces the moisture resistance ability of the compound semiconductor integrated circuit.

Furthermore, the isolation layer must be made of a kind of low dielectric materials having a low dielectric constant, in order to isolate the two layers having different potentials, the bottom metal layer and the top layer. And due to the existence of the isolation layer, especially the essential existence of the isolation layer in the intersection area of the cross-connection of the bottom metal layer and the top layer, thus the impedance of the compound semiconductor integrated circuit around the intersection area of the cross-connection of the bottom metal layer and the top layer is affected by the isolation layer.

Accordingly, the inventor has developed a layout method for compound semiconductor integrated circuits, which may avoid the above mentioned drawbacks, may significantly enhance the moisture resistance ability of the compound semiconductor integrated circuits, and also may enhance the performance of the compound semiconductor integrated circuits, may take into account economic considerations. Therefore, the present invention then has been invented.

SUMMARY OF THE INVENTION

There are two technical problems that the present invention is seeking to solve: the first one is that if the wide range, where the isolation layer of polyimide is unnecessary, of the isolation layer of polyimide can be removed efficiently, the moisture resistance ability of the compound semiconductor integrated circuit may be significantly enhanced. Hence how to form an isolation layer to isolate the two layers having different potentials, the bottom metal layer and the top layer, and to efficiently remove the isolate layer in the wide range outside the intersection area of the cross-connection of the bottom metal layer and the top layer, so as to significantly enhance the moisture resistance ability of the compound semiconductor integrated circuit is the first technical problem that the present invention is seeking to solve.

The second is that if the wide range, where the isolation layer is unnecessary, of the isolation layer can be removed efficiently, not only the influence of the isolation layer to the impedance of the compound semiconductor integrated circuit may be reduced, but even more through designing and adjusting the thickness, area and shape of the isolation layer and choosing the dielectric constant of the low dielectric material for forming the isolation layer existed around the intersection area of the cross-connection of the bottom metal layer and the top layer are affected by the isolation layer, so as to affect the impedance of the compound semiconductor integrated circuit to benefit the performance of the compound semiconductor integrated circuit. Thereby the impedance is originally harmful to the compound semiconductor integrated circuit, now may be turned into benefiting the performance of the compound semiconductor integrated circuit. Hence how to reduce harmful impact of the isolation layer to the impedance of the compound semiconductor integrated circuit, by means of designing and adjusting the thickness, area and shape of the isolation layer and choosing the dielectric constant of the low dielectric material for forming the isolation layer existed around the intersection area of the cross-connection of the bottom metal layer and the top layer, so as to enhance the performance of the compound semiconductor integrated circuit. This is the second technical problem the present invention is seeking to solve.

In order to solve the problems mentioned the above and to achieve the expected effect, the present invention provides a layout method for compound semiconductor integrated circuits comprising following steps of: A1: defining a compound semiconductor integrated circuit layout area on a top surface of a compound semiconductor substrate, wherein said compound semiconductor integrated circuit layout area includes a first circuit layout area and a second circuit layout area; said first circuit layout area and said second circuit layout area intersect at an intersection area; an adjacent crossover area is defined to include said intersection area and a peripheral adjacent area of said intersection area; A2: defining a first dielectric area on said top surface of said compound semiconductor substrate, wherein said first dielectric area is located within said adjacent crossover area, and said first dielectric area intersects with at least part of said intersection area; a second dielectric area is defined as the area outside said first dielectric area on said top surface of said compound semiconductor substrate; A3: forming a first metal layer within said first circuit layout area; A4: forming a low dielectric block made of a low dielectric material, wherein said low dielectric block is formed within both said first dielectric area and said second dielectric area, wherein a first dielectric block is defined as said low dielectric block within said first dielectric area, a second dielectric block is defined as said low dielectric block within said second dielectric area; the thickness of said second dielectric block is no greater than the thickness of said first dielectric block, and the thickness of at least part of said second dielectric block is smaller than the thickness of said first dielectric block; and A5: forming a second metal layer within said second circuit layout area.

In one embodiment, said low dielectric material has a water absorption rate lower than 5%.

In one embodiment, said low dielectric material is at least one material selected from the group consisting of polybenzoxazole (PBO) and Benzo Cyclobutane (BCB).

In one embodiment of the layout method for compound semiconductor integrated circuits, in the step of A4, forming said low dielectric block comprises following steps of: forming a first low dielectric layer within both said first dielectric area and said second dielectric area, wherein the thickness of said first low dielectric layer is equal to the thickness of said second dielectric block; and forming a second low dielectric layer within said first dielectric area, wherein a sum of the thickness of said second low dielectric layer and the thickness of said first low dielectric layer is equal to the thickness of said first dielectric block.

In one embodiment of the layout method for compound semiconductor integrated circuits, in the step of A4, forming said low dielectric block comprises following steps of: forming a first low dielectric layer within both said first dielectric area and said second dielectric area, wherein the thickness of said first low dielectric layer is equal to the thickness of said second dielectric block; forming a second low dielectric layer within both said first dielectric area and said second dielectric area, wherein a sum of the thickness of said second low dielectric layer and the thickness of said first low dielectric layer is equal to the thickness of said first dielectric block; and removing said second low dielectric layer within said second dielectric area by using the exposure and development or etching.

In one embodiment of the layout method for compound semiconductor integrated circuits, in the step of A4, forming said low dielectric block comprises following steps of: forming said low dielectric block within both said first dielectric area and said second dielectric area, wherein the thickness of said low dielectric block is equal to the thickness of said first dielectric block; and removing said low dielectric block within said second dielectric area by using the exposure and development or etching, such that the thickness of said low dielectric block within said first dielectric area is equal to the thickness of said first dielectric block, and the thickness of said low dielectric block within said second dielectric area is equal to the thickness of said second dielectric block.

In one embodiment of the layout method for compound semiconductor integrated circuits, in the step of A4, forming said low dielectric block comprises following steps of: forming said low dielectric block within both said first dielectric area and said second dielectric area; and removing said low dielectric block within both said first dielectric area and said second dielectric area by using the exposure and development or etching, such that the thickness of said low dielectric block within said first dielectric area is equal to the thickness of said first dielectric block, and the thickness of said low dielectric block within said second dielectric area is equal to the thickness of said second dielectric block.

In one embodiment, said peripheral adjacent area of said intersection area includes the area surrounding said intersection area within the range of 50 μm.

In one embodiment, said low dielectric material has a dielectric constant less than 7.

In one embodiment of the layout method for compound semiconductor integrated circuits, forming said first dielectric block further comprises following step of: according to the need of an impedance of said compound semiconductor integrated circuit near said adjacent crossover area, deciding a thickness, an area and a shape of said first dielectric block corresponding to said adjacent crossover area, and a dielectric constant of said low dielectric material to form said first dielectric block, so as to enhance the performance of said compound semiconductor integrated circuits.

In one embodiment, the layout method for compound semiconductor integrated circuits further comprises following steps of: defining a power amplifier layout area within said compound semiconductor integrated circuit layout area; forming a power amplifier within said power amplifier layout area, wherein said power amplifier includes a first terminal, a second terminal and a third terminal; one of said first terminal and said second terminal is an output terminal of said power amplifier; said first terminal is electrically connected with one of said first metal layer and said second metal layer while said second terminal is electrically connected with the other one of said first metal layer and said second metal layer, such that said first terminal and said second terminal of said power amplifier are isolated by said first dielectric block; and according to the need of an output impedance between said first terminal and said second terminal of said power amplifier near said adjacent crossover area, deciding the thickness, the area and the shape of said first dielectric block corresponding to said adjacent crossover area, and a dielectric constant of said low dielectric material to form said first dielectric block, so as to enhance the performance of said compound semiconductor integrated circuit.

In one embodiment, said power amplifier is a bipolar transistor or a heterojunction bipolar transistor; said first terminal is a collector electrode, said second terminal is an emitter electrode, said third terminal is a base electrode; said output impedance is the impedance between said collector electrode and said emitter electrode of said power amplifier.

In one embodiment, said power amplifier is a field effect transistor; said first terminal is a drain electrode, said second terminal is a source electrode, said third terminal is a gate electrode; said output impedance is the impedance between said drain electrode and said source electrode of said power amplifier.

In one embodiment, the layout method for compound semiconductor integrated circuits further comprises following steps of: defining a main power amplifier layout area and a bias circuit power amplifier layout area within said compound semiconductor integrated circuit layout area; forming a main power amplifier within said main power amplifier layout area, wherein said main power amplifier includes a main power amplifier first terminal, a main power amplifier second terminal and a main power amplifier third terminal; said main power amplifier third terminal is an input terminal of said main power amplifier; forming a bias circuit power amplifier within said bias circuit power amplifier layout area, wherein said bias circuit power amplifier includes a bias circuit power amplifier first terminal, a bias circuit power amplifier second terminal and a bias circuit power amplifier third terminal; said bias circuit power amplifier first terminal is electrically connected with one of said first metal layer and said second metal layer while said main power amplifier third terminal is electrically connected with the other one of said first metal layer and said second metal layer, such that said bias circuit power amplifier first terminal and said main power amplifier third terminal are isolated by said first dielectric block; and according to the need of an impedance between said bias circuit power amplifier first terminal and said main power amplifier third terminal near said adjacent crossover area, deciding a thickness, an area and a shape of said first dielectric block corresponding to said adjacent crossover area, and a dielectric constant of said low dielectric material to form said first dielectric block, so as to enhance the performance of said compound semiconductor integrated circuit, wherein said impedance is an input impedance of said main power amplifier.

In one embodiment, said main power amplifier and said bias circuit power amplifier are a bipolar transistor or a heterojunction bipolar transistor; said main power amplifier first terminal is a main power amplifier collector electrode, said main power amplifier second terminal is a main power amplifier emitter electrode, said main power amplifier third terminal is a main power amplifier base electrode, said bias circuit power amplifier first terminal is a bias circuit power amplifier collector electrode, said bias circuit power amplifier second terminal is a bias circuit power amplifier emitter electrode, said bias circuit power amplifier third terminal is a bias circuit power amplifier base electrode, wherein said input impedance is the impedance between said bias circuit power amplifier collector electrode and said main power amplifier base electrode.

In one embodiment, said main power amplifier and said bias circuit power amplifier are a field effect transistor; said main power amplifier first terminal is a main power amplifier drain electrode, said main power amplifier second terminal is a main power amplifier source electrode, said main power amplifier third terminal is a main power amplifier gate electrode, said bias circuit power amplifier first terminal is a bias circuit power amplifier drain electrode, said bias circuit power amplifier second terminal is a bias circuit power amplifier source electrode, said bias circuit power amplifier third terminal is a bias circuit power amplifier gate electrode; said input impedance is the impedance between said bias circuit power amplifier drain electrode and said main power amplifier gate electrode.

In one embodiment of the layout method for compound semiconductor integrated circuits, between the step of A3 and the step of A4, further comprises a step of forming at least one upper insulating layer, wherein said at least one upper insulating layer is formed on said compound semiconductor substrate and said first metal layer, and said at least one upper insulating layer is formed below said low dielectric block.

In one embodiment, said at least one upper insulating layer is made of at least one material selected from the group consisting of SiN and $SiO_2$.

In one embodiment, the layout method for compound semiconductor integrated circuits before the step of A3 further comprises a step of forming at least one lower insulating layer, wherein said at least one lower insulating layer is formed on said compound semiconductor substrate, and said at least one lower insulating layer is formed below said first metal layer and said low dielectric block.

In one embodiment, said at least one lower insulating layer is made of at least one material selected from the group consisting of SiN and $SiO_2$.

In one embodiment, the layout method for compound semiconductor integrated circuits after the step of A5 further comprises a step of forming at least one protection layer on said compound semiconductor integrated circuit.

In one embodiment, said at least one protection layer is made of at least one material selected from the group consisting of polybenzoxazole (PBO), SiN and $SiO_2$.

The present invention further provides a layout method for compound semiconductor integrated circuits comprising following steps of: B1: defining a compound semiconductor integrated circuit layout area on a top surface of a compound semiconductor substrate, wherein said compound semiconductor integrated circuit layout area includes a first circuit layout area and a second circuit layout area; said first circuit layout area and said second circuit layout area intersect at an intersection area; an adjacent crossover area is defined to include said intersection area and a peripheral adjacent area of said intersection area; B2: defining a first dielectric area on said top surface of said compound semiconductor substrate, wherein said first dielectric area is located within said adjacent crossover area, and said first dielectric area intersects with at least part of said intersection area; a second dielectric area is defined as the area outside said first dielectric area on said top surface of said compound semiconductor substrate; B3: forming a first metal layer within said first circuit layout area; B4: forming a first dielectric block made of a low dielectric material within said first dielectric area; and B5: forming a second metal layer within said second circuit layout area.

In one embodiment, said low dielectric material has a water absorption rate lower than 5%.

In one embodiment, said low dielectric material is at least one material selected from the group consisting of polybenzoxazole (PBO) and Benzo Cyclobutane (BCB).

In one embodiment of the layout method for compound semiconductor integrated circuits, in the step of B4, forming said first dielectric block comprises following steps of: forming a low dielectric block within both said first dielectric area and said second dielectric area; and removing said low dielectric block within said second dielectric area by using the exposure and development or etching, such that the thickness of said low dielectric block within said first dielectric area is equal to the thickness of said first dielectric block, and the thickness of said low dielectric block within said second dielectric area is equal to zero.

In one embodiment of the layout method for compound semiconductor integrated circuits, in the step of B4, forming said first dielectric block comprises following steps of: forming a low dielectric block within both said first dielectric area and said second dielectric area; and removing said low dielectric block within both said first dielectric area and said second dielectric area by using the exposure and development or etching, such that the thickness of said low dielectric block within said first dielectric area is equal to the thickness of said first dielectric block, and the thickness of said low dielectric block within said second dielectric area is equal to zero.

In one embodiment, said peripheral adjacent area of said intersection area includes the area surrounding said intersection area within the range of 50 μm.

In one embodiment, said low dielectric material has a dielectric constant less than 7.

In one embodiment of the layout method for compound semiconductor integrated circuits, forming said first dielectric block further comprises following step of: according to the need of an impedance of said compound semiconductor integrated circuit near said adjacent crossover area, deciding a thickness, an area and a shape of said first dielectric block corresponding to said adjacent crossover area, and a dielectric constant of said low dielectric material to form said first dielectric block, so as to enhance the performance of said compound semiconductor integrated circuit.

In one embodiment, the layout method for compound semiconductor integrated circuits further comprises following steps of: defining a power amplifier layout area within said compound semiconductor integrated circuit layout area;

forming a power amplifier within said power amplifier layout area, wherein said power amplifier includes a first terminal, a second terminal and a third terminal; one of said first terminal and said second terminal is an output terminal of said power amplifier; said first terminal is electrically connected with one of said first metal layer and said second metal layer while said second terminal is electrically connected with the other one of said first metal layer and said second metal layer, such that said first terminal and said second terminal of said power amplifier are isolated by said first dielectric block; and according to the need of an output impedance between said first terminal and said second terminal of said power amplifier near said adjacent crossover area, deciding the thickness, the area and the shape of said first dielectric block corresponding to said adjacent crossover area, and a dielectric constant of said low dielectric material to form said first dielectric block, so as to enhance the performance of said compound semiconductor integrated circuit.

In one embodiment, said power amplifier is a bipolar transistor or a heterojunction bipolar transistor; said first terminal is a collector electrode, said second terminal is an emitter electrode, said third terminal is a base electrode; said output impedance is the impedance between said collector electrode and said emitter electrode of said power amplifier.

In one embodiment, said power amplifier is a field effect transistor; said first terminal is a drain electrode, said second terminal is a source electrode, said third terminal is a gate electrode; said output impedance is the impedance between said drain electrode and said source electrode of said power amplifier.

In one embodiment, the layout method for compound semiconductor integrated circuits further comprises following steps of: defining a main power amplifier layout area and a bias circuit power amplifier layout area within said compound semiconductor integrated circuit layout area; forming a main power amplifier within said main power amplifier layout area, wherein said main power amplifier includes a main power amplifier first terminal, a main power amplifier second terminal and a main power amplifier third terminal; said main power amplifier third terminal is an input terminal of said main power amplifier; forming a bias circuit power amplifier within said bias circuit power amplifier layout area, wherein said bias circuit power amplifier includes a bias circuit power amplifier first terminal, a bias circuit power amplifier second terminal and a bias circuit power amplifier third terminal; said bias circuit power amplifier first terminal is electrically connected with one of said first metal layer and said second metal layer while said main power amplifier third terminal is electrically connected with the other one of said first metal layer and said second metal layer, such that said bias circuit power amplifier first terminal and said main power amplifier third terminal are isolated by said first dielectric block; and according to the need of an impedance between said bias circuit power amplifier first terminal and said main power amplifier third terminal near said adjacent crossover area, deciding the thickness, the area and the shape of said first dielectric block corresponding to said adjacent crossover area, and a dielectric constant of said low dielectric material to form said first dielectric block, so as to enhance the performance of said compound semiconductor integrated circuit, wherein said impedance is an input impedance of said main power amplifier.

In one embodiment, said main power amplifier and said bias circuit power amplifier are a bipolar transistor or a heterojunction bipolar transistor; said main power amplifier first terminal is a main power amplifier collector electrode, said main power amplifier second terminal is a main power amplifier emitter electrode, said main power amplifier third terminal is a main power amplifier base electrode, said bias circuit power amplifier first terminal is a bias circuit power amplifier collector electrode, said bias circuit power amplifier second terminal is a bias circuit power amplifier emitter electrode, said bias circuit power amplifier third terminal is a bias circuit power amplifier base electrode; said input impedance is the impedance between said bias circuit power amplifier collector electrode and said main power amplifier base electrode.

In one embodiment, said main power amplifier and said bias circuit power amplifier are a field effect transistor; said main power amplifier first terminal is a main power amplifier drain electrode, said main power amplifier second terminal is a main power amplifier source electrode, said main power amplifier third terminal is a main power amplifier gate electrode, said bias circuit power amplifier first terminal is a bias circuit power amplifier drain electrode, said bias circuit power amplifier second terminal is a bias circuit power amplifier source electrode, said bias circuit power amplifier third terminal is a bias circuit power amplifier gate electrode; said input impedance is the impedance between said bias circuit power amplifier drain electrode and said main power amplifier gate electrode.

In one embodiment, the layout method for compound semiconductor integrated circuits, between the step of B3 and the step of B4, further comprises a step of forming at least one upper insulating layer; said at least one upper insulating layer is formed on said compound semiconductor substrate and said first metal layer, and said at least one upper insulating layer is formed below said first dielectric block.

In one embodiment, said at least one upper insulating layer is made of at least one material selected from the group consisting of SiN and $SiO_2$.

In one embodiment, the layout method for compound semiconductor integrated circuits before the step of B3 further comprises a step of forming at least one lower insulating layer; said at least one lower insulating layer is formed on said compound semiconductor substrate, and said at least one lower insulating layer is formed below said first metal layer and said first dielectric block.

In one embodiment, said at least one lower insulating layer is made of at least one material selected from the group consisting of SiN and $SiO_2$.

In one embodiment, the layout method for compound semiconductor integrated circuits after the step of B5 further comprises a step of forming at least one protection layer on said compound semiconductor integrated circuit.

In one embodiment, said at least one protection layer is made of at least one material selected from the group consisting of polybenzoxazole (PBO), SiN and $SiO_2$.

For further understanding the characteristics and effects of the present invention, some preferred embodiments referred to drawings are in detail described as follows.

DETAILED DESCRIPTIONS OF PREFERRED EMBODIMENTS

Figure 1:
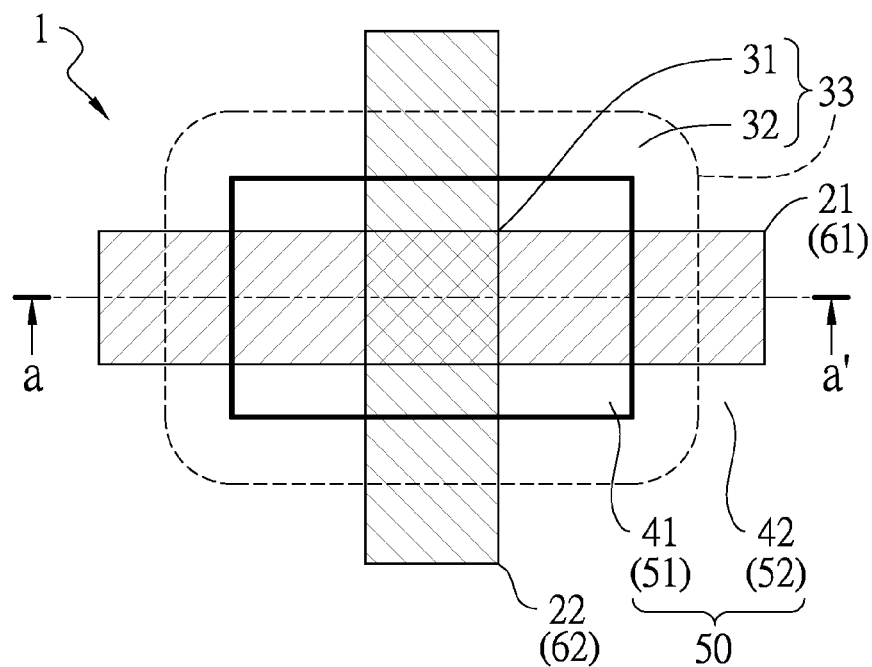
FIGS. 1 and 1A show, respectively, the top view and the cross-sectional view of an embodiment of a layout method for compound semiconductor integrated circuits of the present invention.
Figure 1A:
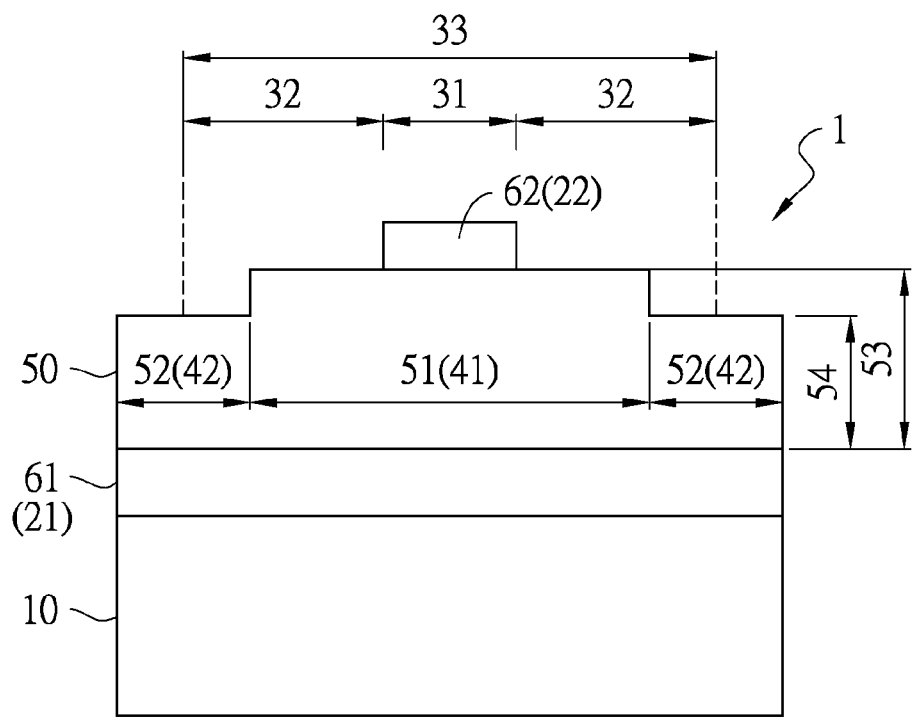

Please refer to FIGS. 1 and 1A (along the broken line a-a' in FIG. 1) which show, respectively, the top view and the cross-sectional view of an embodiment of a layout method for compound semiconductor integrated circuits of the present invention. A compound semiconductor integrated circuit layout area 1 is defined on a top surface of a compound semiconductor substrate 10, wherein the compound semiconductor integrated circuit layout area 1 includes a first circuit layout area 21 and a second circuit layout area 22. A first metal layer 61 is formed within the first circuit layout area 21. The first circuit layout area 21 and the second circuit layout area 22 intersect at an intersection area 31. An adjacent crossover area 33 is defined to include the intersection area 31 and a peripheral adjacent area 32 of the intersection area 31. A first dielectric area 41 (the thick border frame area) is defined on the top surface of the compound semiconductor substrate 10, wherein the first dielectric area 41 is located within the adjacent crossover area 33, and the first dielectric area 41 intersects with at least part of the intersection area 31 (in current embodiment, the first dielectric area 41 includes the whole intersection area 31). The area outside the first dielectric area 41 (the thick border frame area) on the top surface of the compound semiconductor substrate 10 is defined as a second dielectric area 42. A low dielectric block 50 made of a low dielectric material is formed on the compound semiconductor substrate 10 and the first metal layer 61. In current embodiment, the low dielectric block 50 is formed within both the first dielectric area 41 (the thick border frame area) and the second dielectric area 42. The low dielectric block 50 within the first dielectric area 41 is defined as a first dielectric block 51 (the thick border frame area). The first dielectric block 51 has a thickness 53. The low dielectric block 50 within the second dielectric area 42 is defined as a second dielectric block 52. The second dielectric block 52 has a thickness 54, wherein the thickness 54 of the second dielectric block 52 is no greater than the thickness 53 of the first dielectric block 51, and the thickness 54 of at least part of the second dielectric block 52 is smaller than the thickness 53 of the first dielectric block 51 (as shown in FIG. 1A). A second metal layer 62 is formed within the second circuit layout area 22. In current embodiment, the second metal layer 62 is formed on the first dielectric block 51 and the second dielectric block 52.

In the drawings of FIGS. 1, 1B, 1D, 1F, 1H, 1J, 1L, 1N, 1P, 1Q, 3 and 4 of the present invention, the first metal layer 61 is within the area where the hatching at 45 degrees, while the second metal layer 62 is within the area where the hatching at 135 degrees. The intersection area 31 is the area where the hatching at 45 degrees and the hatching 135 degrees intersect at. The thick border frame area is the first dielectric area 41, which is also the area where the first dielectric block 51 is formed. Furthermore, in FIGS. 3 and 3A, the thick border frame area is also the first dielectric area 41 and also where the first dielectric block 51 is formed.

Figure 1B:
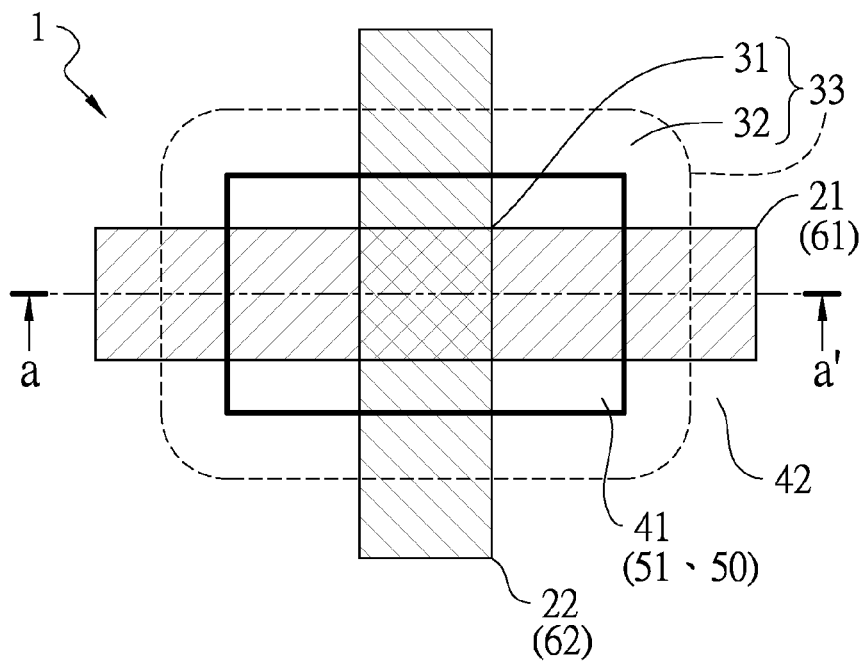
FIGS. 1B and 1C show, respectively, the top view and the cross-sectional view of an embodiment of a layout method for compound semiconductor integrated circuits of the present invention.
Figure 1C:
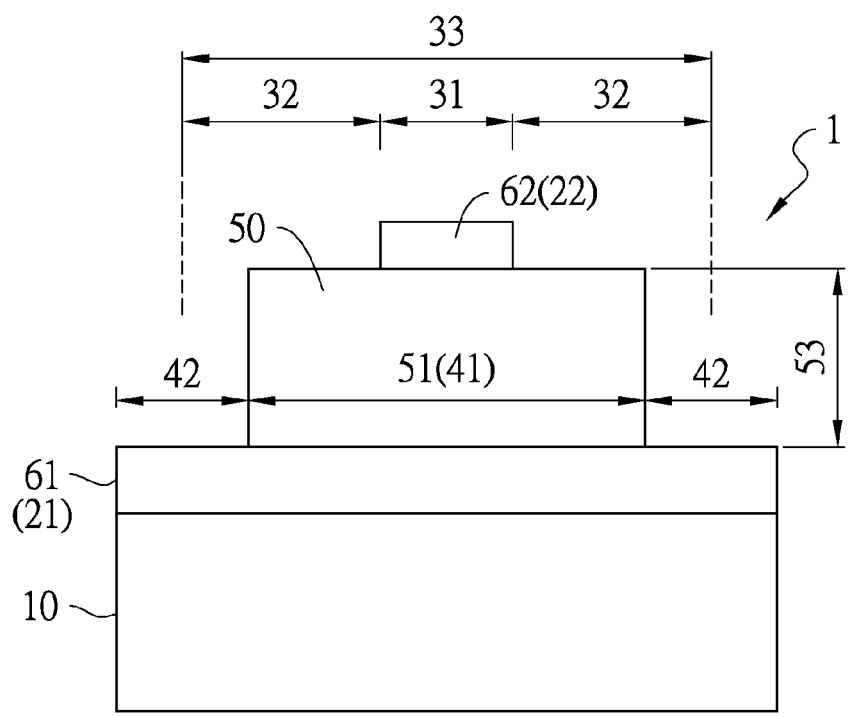

Please refer to FIGS. 1B and 1C (along the broken line a-a' in FIG. 1B) which show, respectively, the top view and the cross-sectional view of another embodiment of a layout method for compound semiconductor integrated circuits of the present invention. A compound semiconductor integrated circuit layout area 1 is defined on a top surface of a compound semiconductor substrate 10, wherein the compound semiconductor integrated circuit layout area 1 includes a first circuit layout area 21 and a second circuit layout area 22. A first metal layer 61 is formed within the first circuit layout area 21. The first circuit layout area 21 and the second circuit layout area 22 intersect at an intersection area 31. An adjacent crossover area 33 is defined to include the intersection area 31 and a peripheral adjacent area 32 of the intersection area 31. A first dielectric area 41 (the thick border frame area) is defined on the top surface of the compound semiconductor substrate 10, wherein the first dielectric area 41 is located within the adjacent crossover area 33, and the first dielectric area 41 intersects with at least part of the intersection area 31 (in current embodiment, the first dielectric area 41 includes the whole intersection area 31). The area outside the first dielectric area 41 (the thick border frame area) on the top surface of the compound semiconductor substrate 10 is defined as a second dielectric area 42. A low dielectric block 50 made of a low dielectric material is formed on the compound semiconductor substrate 10 and the first metal layer 61. In current embodiment, the low dielectric block 50 is formed only within the first dielectric area 41 (the thick border frame area), but not within the second dielectric area 42. Therefore, in current embodiment, there is no "second dielectric block 52" within the second dielectric area 42. The low dielectric block 50 within the first dielectric area 41 is defined as a first dielectric block 51 (the thick border frame area). The first dielectric block 51 has a thickness 53. A second metal layer 62 is formed within the second circuit layout area 22. In current embodiment, the second metal layer 62 is formed on the first dielectric block 51 and the compound semiconductor substrate 10.

In the embodiments shown in FIG. 1~1C, the low dielectric block 50 may include both the first dielectric block 51 (the thick border frame area) and the second dielectric block 52 (referring to the embodiment shown in FIGS. 1 and 1A), or include only the first dielectric block 51 (the thick border frame area) but without the second dielectric block 52 (referring to the embodiment shown in FIGS. 1B and 1C). The main function of the first dielectric block 51 is to isolate the two layers having different potentials, the first metal layer 61 and the second metal layer 62. However the second dielectric block 52 will significantly reduce the moisture resistance ability of the compound semiconductor integrated circuit 1. Hence, when the thickness 54 of the second dielectric block 52 is no greater than the thickness 53 of the first dielectric block 51, and the thickness 54 of at least part of the second dielectric block 52 is smaller than the thickness 53 of the first dielectric block 51, it will benefit enhancing the moisture resistance ability of the compound semiconductor integrated circuit 1. Especially when the thickness 54 of the second dielectric block 52 is less than 90% of the thickness 53 of the first dielectric block 51, it may significantly enhance the moisture resistance ability of the compound semiconductor integrated circuit 1. The less the thickness 54 of the second dielectric block 52 is, the more obvious the enhancement of the moisture resistance ability of the compound semiconductor integrated circuit 1 is. When the entire second dielectric block 52 is removed (i.e. as the embodiment shown in FIGS. 1 and 1C, without the second dielectric block 52), it has the excellent enhancement of the moisture resistance ability of the compound semiconductor integrated circuit 1.

Among all the embodiments of the present invention, some have a second dielectric block 52, while the other have no second dielectric block 52. In the embodiments having a second dielectric block 52 of the present invention, at least part of the second dielectric block 52 has a thickness 54 greater than 0 and smaller 90% of the thickness 53 of the first dielectric block 51, greater than 0 and smaller 85% of the thickness 53 of the first dielectric block 51, greater than 0 and smaller 80% of the thickness 53 of the first dielectric block 51, greater than 0 and smaller 75% of the thickness 53 of the first dielectric block 51, greater than 0 and smaller 70% of the thickness 53 of the first dielectric block 51, greater than 0 and smaller 65% of the thickness 53 of the first dielectric block 51, greater than 0 and smaller 60% of the thickness 53 of the first dielectric block 51, greater than 0 and smaller 55% of the thickness 53 of the first dielectric block 51, greater than 0 and smaller 50% of the thickness 53 of the first dielectric block 51, greater than 0 and smaller 45% of the thickness 53 of the first dielectric block 51, greater than 0 and smaller 40% of the thickness 53 of the first dielectric block 51, greater than 0 and smaller 35% of the thickness 53 of the first dielectric block 51, greater than 0 and smaller 30% of the thickness 53 of the first dielectric block 51, greater than 0 and smaller 25% of the thickness 53 of the first dielectric block 51, greater than 0 and smaller 20% of the thickness 53 of the first dielectric block 51, greater than 0 and smaller 15% of the thickness 53 of the first dielectric block 51, greater than 0 and smaller 12% of the thickness 53 of the first dielectric block 51, greater than 0 and smaller 10% of the thickness 53 of the first dielectric block 51, greater than 0 and smaller 9% of the thickness 53 of the first dielectric block 51, greater than 0 and smaller 8% of the thickness 53 of the first dielectric block 51, greater than 0 and smaller 7% of the thickness 53 of the first dielectric block 51, greater than 0 and smaller 6% of the thickness 53 of the first dielectric block 51, greater than 0 and smaller 5% of the thickness 53 of the first dielectric block 51, greater than 0 and smaller 4% of the thickness 53 of the first dielectric block 51, greater than 0 and smaller 3% of the thickness 53 of the first dielectric block 51, greater than 0 and smaller 2% of the thickness 53 of the first dielectric block 51, or greater than 0 and smaller 1% of the thickness 53 of the first dielectric block 51.

In all the embodiments of the present invention, the intersection area 31 is where the first circuit layout area 21 and the second circuit layout area 22 intersect at. The peripheral adjacent area 32 of the intersection area 31 is the area surrounding the intersection area 31 within the range of at least 50 µm, within the range of at least 47 µm, within the range of at least 45 µm, within the range of at least 43 µm, within the range of at least 40 µm, within the range of at least 37 µm, within the range of at least 35 µm, within the range of at least 33 µm, within the range of at least 30 µm, within the range of at least 28 µm, within the range of at least 25 µm, within the range of at least 23 µm, within the range of at least 20 µm, within the range of at least 17 µm, within the range of at least 15 µm, within the range of at least 12 µm, within the range of at least 10 µm, within the range of at least 9 µm, within the range of at least 8 µm, within the range of at least 7 µm, within the range of at least 6 µm, or within the range of at least 5 µm. The adjacent crossover area 33 is defined to include the intersection area 31 and the peripheral adjacent area 32 of the intersection area 31.

Furthermore, when choosing the low dielectric material for the low dielectric block 50 in the present invention, it is chosen to have a low water absorption rate for the low dielectric block 50. The water absorption rate of the low dielectric material for the low dielectric block 50 is at least lower than 5%, at least lower than 4.5%, at least lower than 4%, at least lower than 3.5%, at least lower than 3%, at least lower than 2.5%, or at least lower than 2%.

In the embodiments of the present invention, the materials for the low dielectric block 50 may be polybenzoxazole (PBO) or Benzo Cyclobutane (BCB). The best choice of the materials for the low dielectric block 50 may be photosensitive polybenzoxazole (PBO) or photosensitive Benzo Cyclobutane (BCB). The second dielectric block 52 may be removed by the method of exposure and development or etching. When choosing photosensitive polybenzoxazole or photosensitive Benzo Cyclobutane as the material of the low dielectric block 50, the second dielectric block 52 made of photosensitive polybenzoxazole or photosensitive Benzo Cyclobutane may be easily entirely removed by the method of exposure and development within the second dielectric area 42, so as to enhance the moisture resistance ability of the compound semiconductor integrated circuit 1.

In all the embodiments of the present invention, the material for the low dielectric block 50 has a dielectric constant at least less than 7, at least less than 6.7, at least less than 6.3, at least less than 6, at least less than 5.7, at least less than 5.3, at least less than 5, at least less than 4.7, at least less than 4.3, at least less than 4, at least less than 3.7, at least less than 3.3, at least less than 3, at least less than 2.7, at least less than 2.3, at least less than 2, at least less than 1.7, at least less than 1.3, or at least less than 1.

Please refer to the embodiments shown in FIG. 1D~1O. In these embodiments, there are respectively various kinds of the intersection area 31, the first dielectric block 51 (the thick border frame area) and the second dielectric block 52. From these embodiments, under the situation that there is only one single intersection area 31 but no other intersection area 31 within the peripheral adjacent area 32 of the intersection area 31, the possibility of various types of intersection area 31, the first dielectric block 51 (the thick border frame area) and the second dielectric block 52 is shown.

Figure 1D:
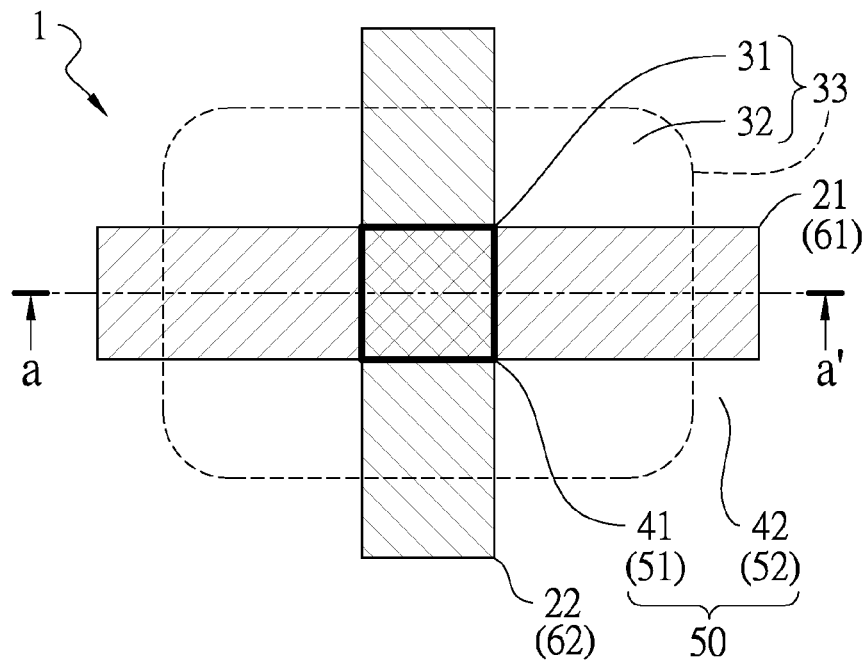
FIGS. 1D and 1E show, respectively, the top view and the cross-sectional view of an embodiment of a layout method for compound semiconductor integrated circuits of the present invention.
Figure 1E:
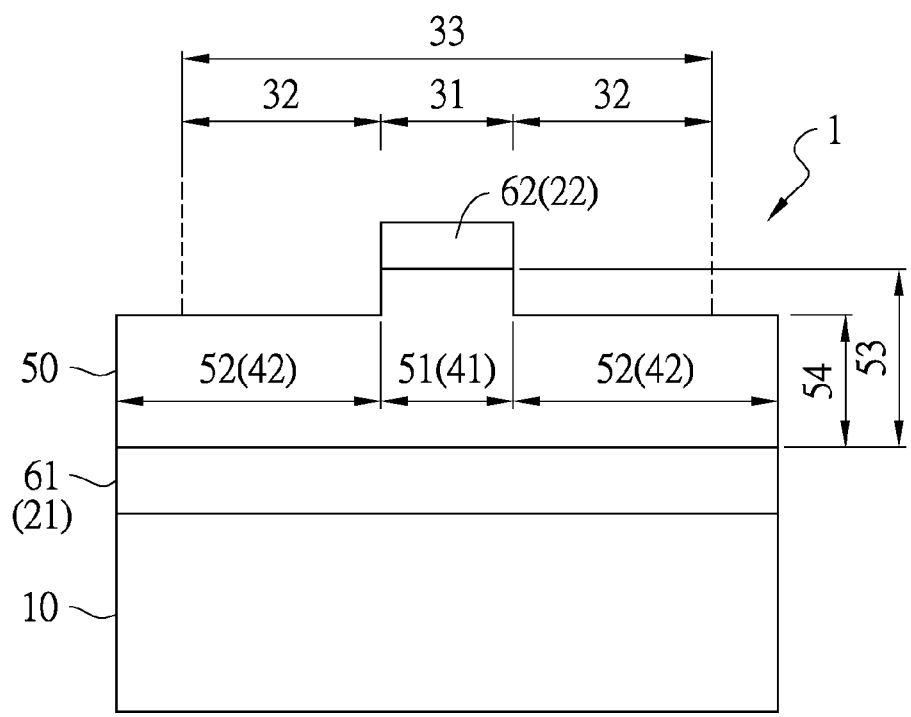

Please refer to FIGS. 1D and 1E (along the broken line a-a' in FIG. 1D) which show, respectively, the top view and the cross-sectional view of another embodiment of a layout method for compound semiconductor integrated circuits of the present invention. The main structure is mostly similar to the structure of the embodiment shown in FIGS. 1 and 1A, except that the first dielectric area 41 (the thick border frame area) and the intersection area 31 have the same size and completely overlap with each other.

Figure 1F:
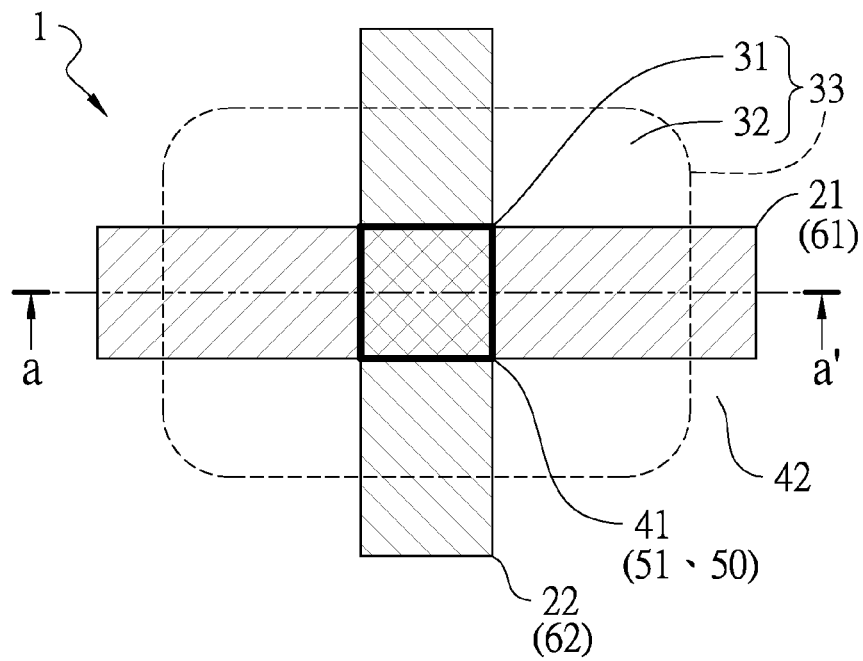
FIGS. 1F and 1G show, respectively, the top view and the cross-sectional view of an embodiment of a layout method for compound semiconductor integrated circuits of the present invention.
Figure 1G:
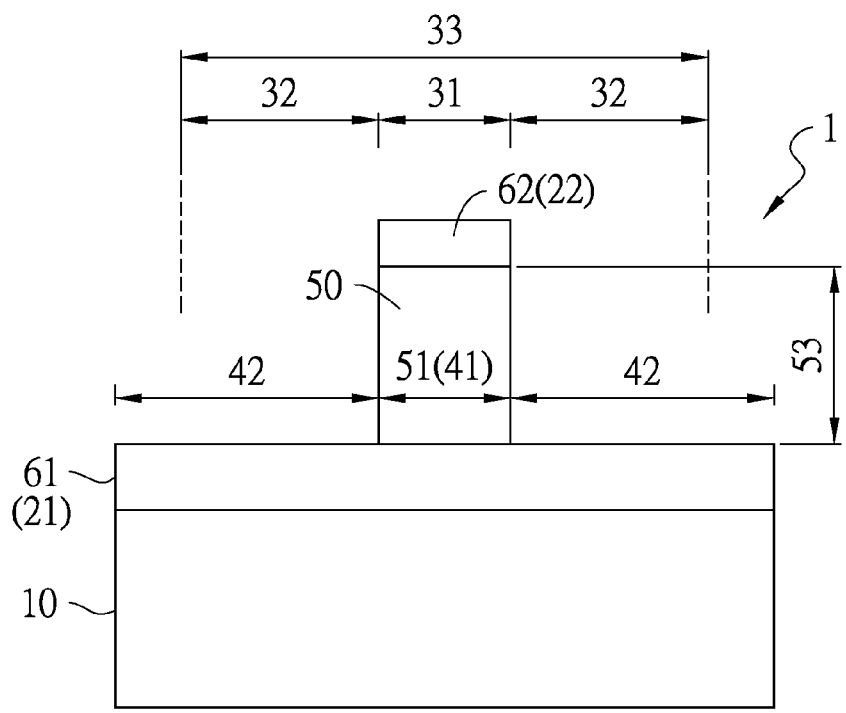

Please refer to FIGS. 1F and 1G (along the broken line a-a' in FIG. 1F) which show, respectively, the top view and the cross-sectional view of another embodiment of a layout method for compound semiconductor integrated circuits of the present invention. The main structure is mostly similar to the structure of the embodiment shown in FIGS. 1D and 1E, except that the low dielectric block 50 is formed only within the first dielectric area 41 (the thick border frame area), but there is no low dielectric block 50 in the second dielectric area 42. Hence, in current embodiment, there is only the first dielectric block 51 (the thick border frame area), but no "second dielectric block 52". In current embodiment, the second metal layer 62 is formed on the first dielectric block 51 and the compound semiconductor substrate 10.

Figure 1H:
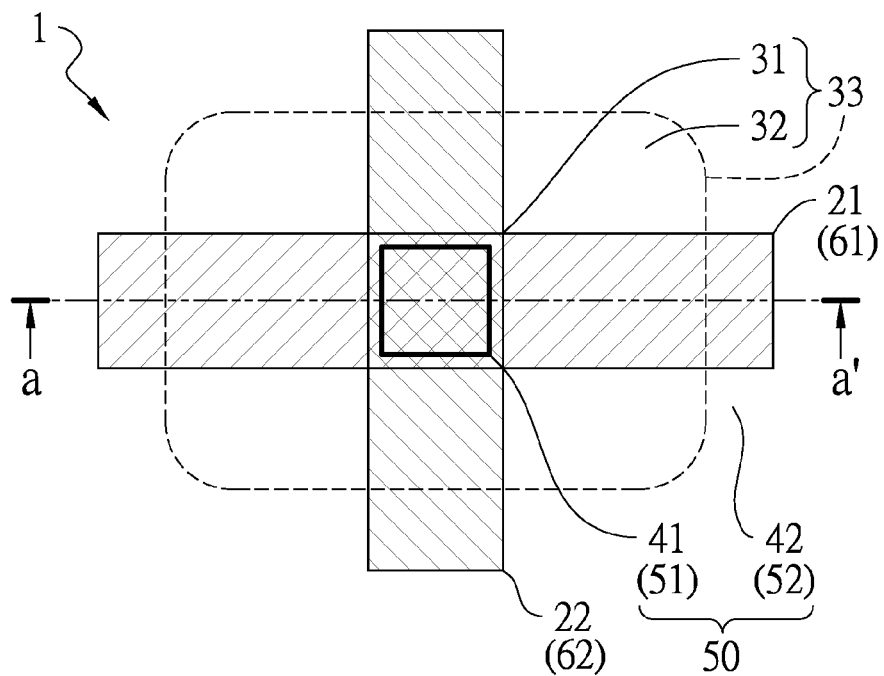
FIGS. 1H and 1I show, respectively, the top view and the cross-sectional view of an embodiment of a layout method for compound semiconductor integrated circuits of the present invention.
Figure 1I:
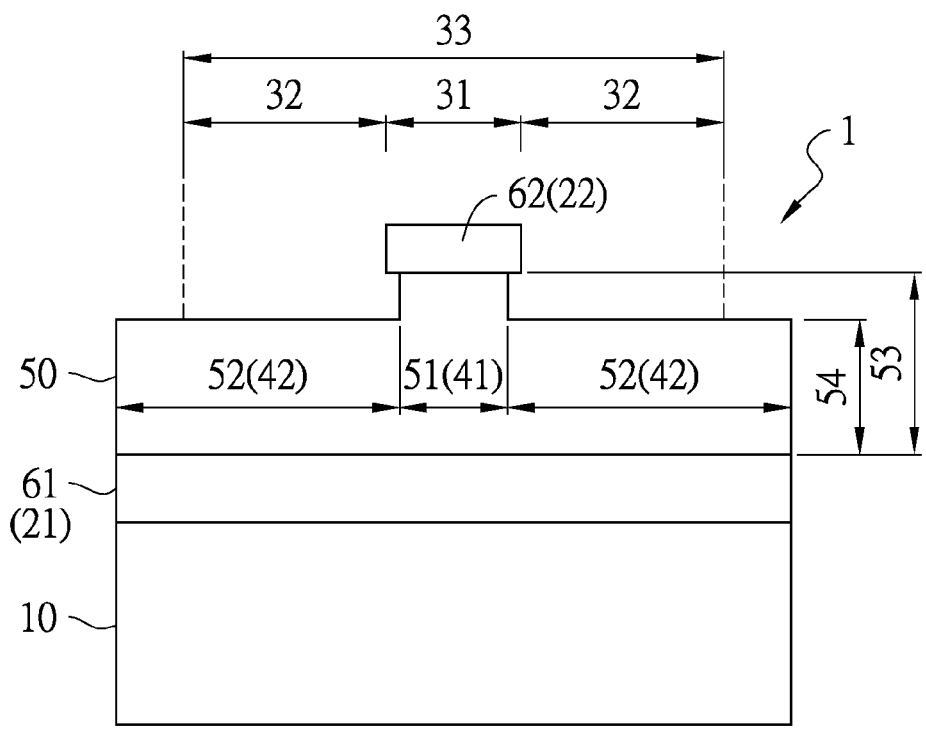

Please refer to FIGS. 1H and 1I (along the broken line a-a' in FIG. 1H) which show, respectively, the top view and the cross-sectional view of another embodiment of a layout method for compound semiconductor integrated circuits of the present invention. The main structure is mostly similar to the structure of the embodiment shown in FIGS. 1 and 1A, except that the first dielectric area 41 (the thick border frame area) is located totally inside the intersection area 31.

Figure 1J:
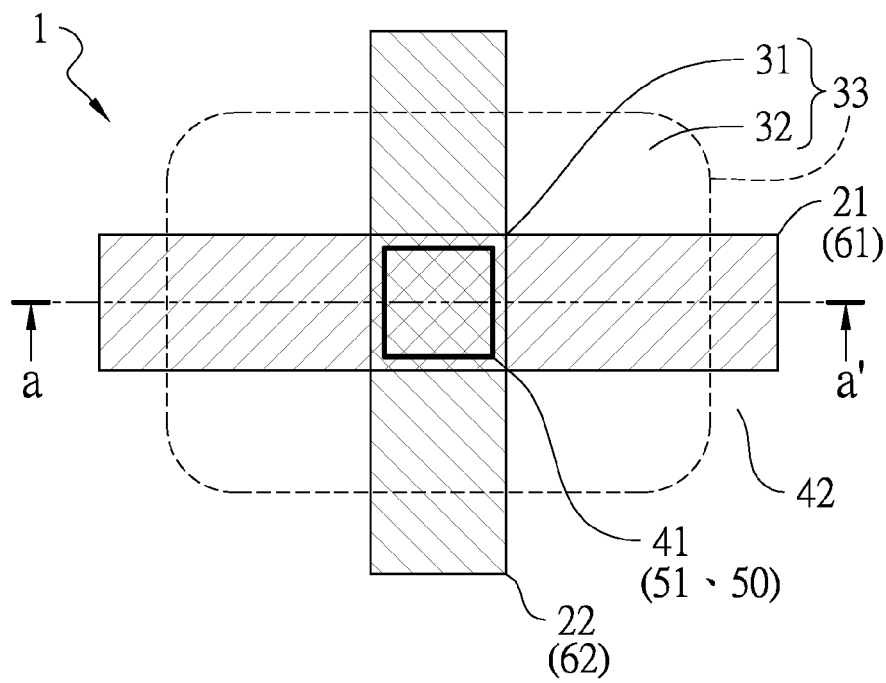
FIGS. 1J and 1K show, respectively, the top view and the cross-sectional view of an embodiment of a layout method for compound semiconductor integrated circuits of the present invention.
Figure 1K:
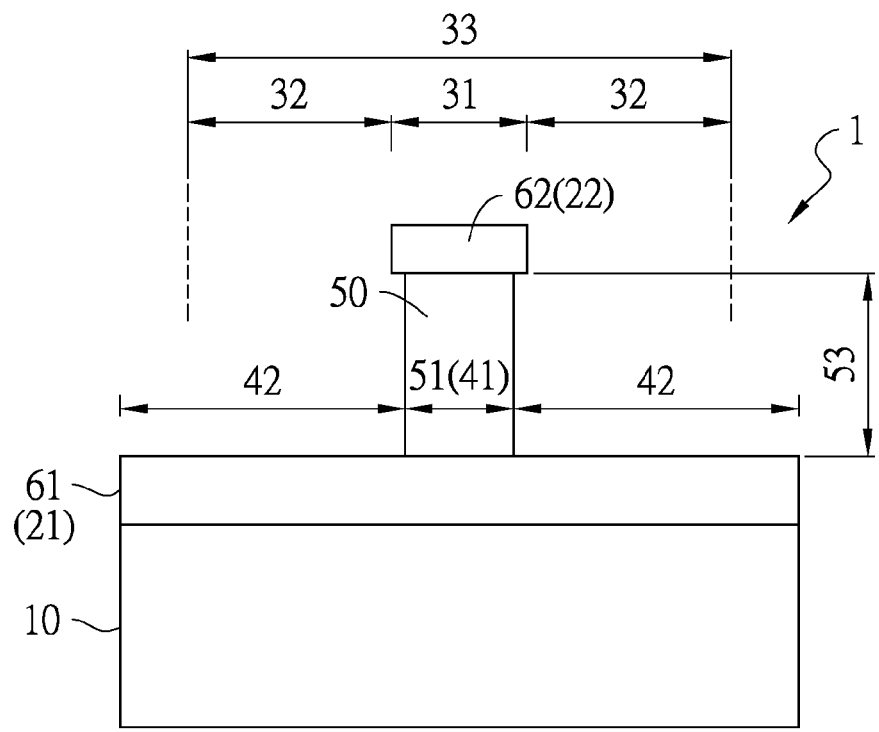

Please refer to FIGS. 1J and 1K (along the broken line a-a' in FIG. 1J) which show, respectively, the top view and the cross-sectional view of another embodiment of a layout method for compound semiconductor integrated circuits of the present invention. The main structure is mostly similar to the structure of the embodiment shown in FIGS. 1H and 1I, except that the low dielectric block 50 is formed only within the first dielectric area 41 (the thick border frame area), but there is no low dielectric block 50 in the second dielectric area 42. Hence, in current embodiment, there is only the first dielectric block 51 (the thick border frame area), but no "second dielectric block 52". In current embodiment, the second metal layer 62 is formed on the first dielectric block 51 and the compound semiconductor substrate 10.

Figure 1L:
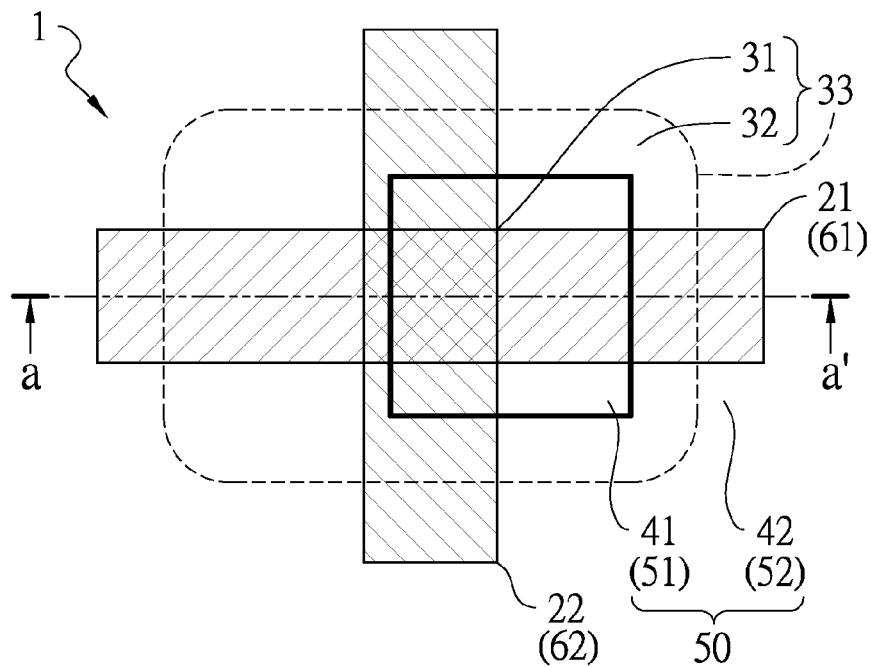
FIGS. 1L and 1M show, respectively, the top view and the cross-sectional view of an embodiment of a layout method for compound semiconductor integrated circuits of the present invention.
Figure 1M:
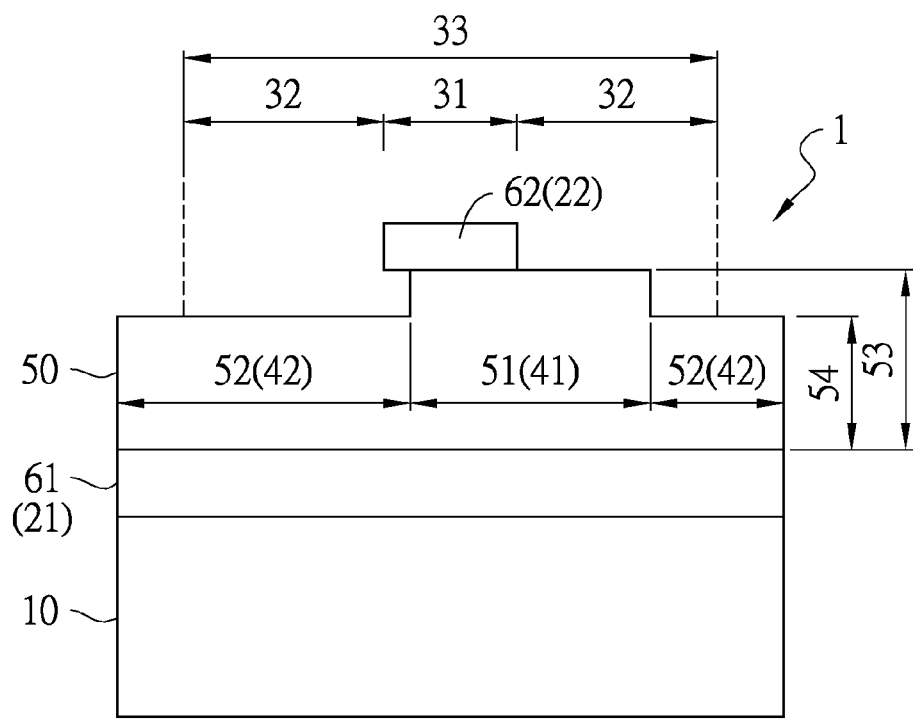

Please refer to FIGS. 1L and 1M (along the broken line a-a' in FIG. 1L) which show, respectively, the top view and the cross-sectional view of another embodiment of a layout method for compound semiconductor integrated circuits of the present invention. The main structure is mostly similar to the structure of the embodiment shown in FIGS. 1 and 1A, except that the first dielectric area 41 (the thick border frame area) intersects with part of the intersection area 31.

Figure 1N:
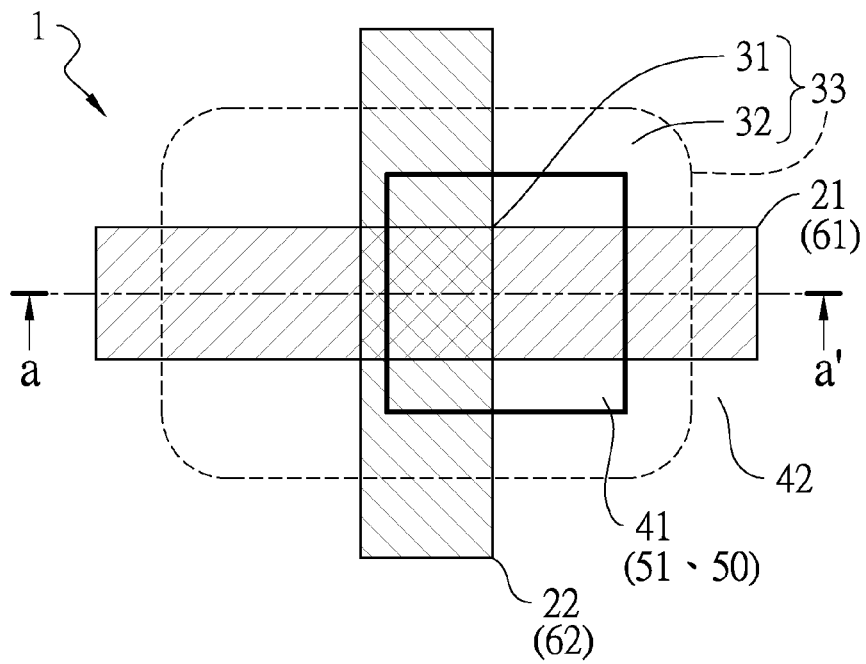
FIGS. 1N and 1O show, respectively, the top view and the cross-sectional view of an embodiment of a layout method for compound semiconductor integrated circuits of the present invention.
Figure 1O:
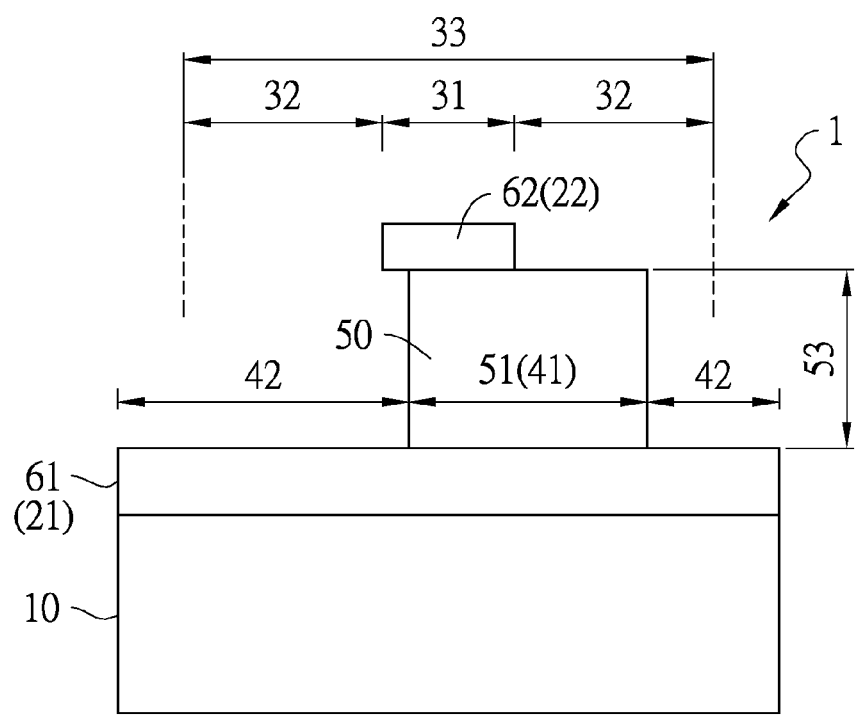

Please refer to FIGS. 1N and 1O (along the broken line a-a' in FIG. 1N) which show, respectively, the top view and the cross-sectional view of another embodiment of a layout method for compound semiconductor integrated circuits of the present invention. The main structure is mostly similar to the structure of the embodiment shown in FIGS. 1L and 1M, except that the low dielectric block 50 is formed only within the first dielectric area 41 (the thick border frame area), but there is no low dielectric block 50 in the second dielectric area 42. Hence, in current embodiment, there is only the first dielectric block 51 (the thick border frame area), but no "second dielectric block 52". In current embodiment, the second metal layer 62 is formed on the first dielectric block 51 and the compound semiconductor substrate 10.

Figure 1P:
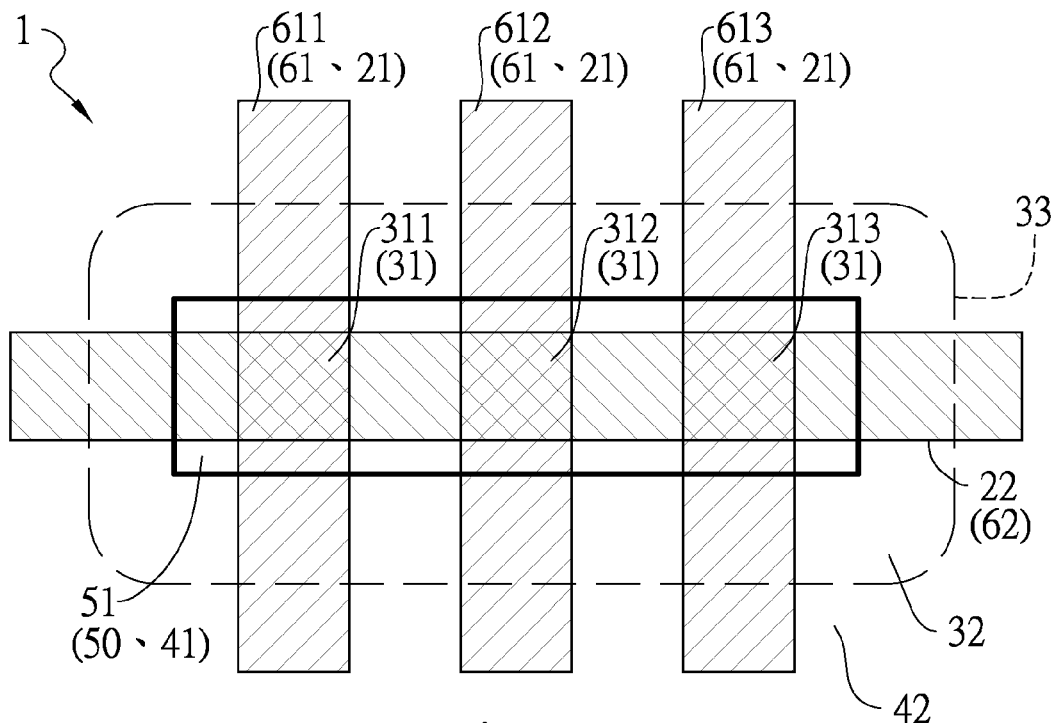
FIG. 1P shows the top view of an embodiment of a layout method for compound semiconductor integrated circuits of the present invention.
Figure 1Q:
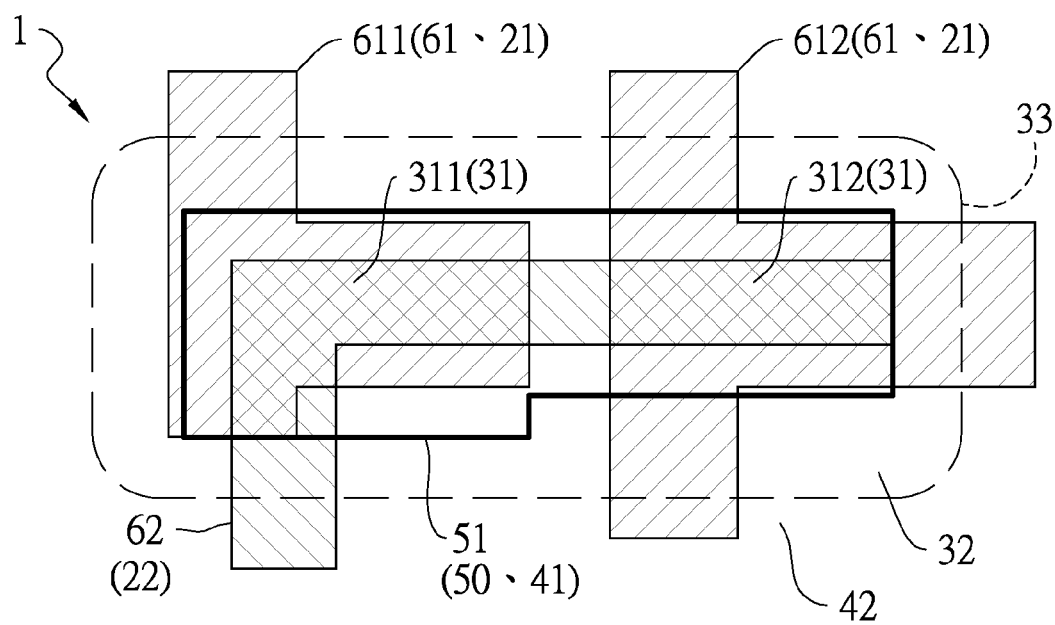
FIG. 1Q shows the top view of an embodiment of a layout method for compound semiconductor integrated circuits of the present invention.

Please refer to the embodiments of FIGS. 1P and 1Q. There are multiple intersection areas 31 with different variations in these embodiments respectively. And these multiple intersection areas 31 are very close in distance. Hence, in these embodiments, the peripheral adjacent area 32 of each intersection area 31 overlaps with other intersection area 31 and/or the peripheral adjacent area 32 of other intersection area 31. Therefore, the adjacent crossover area 33 may be a combination of the areas including these multiple intersection areas 31 and the peripheral adjacent areas 32 of these multiple intersection areas 31. Please firstly refer to FIG. 1P, which shows the top view of an embodiment of a layout method for compound semiconductor integrated circuits of the present invention. A compound semiconductor integrated circuit layout area 1 is defined on a top surface of a compound semiconductor substrate 10 (not shown in the Figure), wherein the compound semiconductor integrated circuit layout area 1 includes a first circuit layout area 21 and a second circuit layout area 22. A first metal layer 61 is formed within the first circuit layout area 21. The first circuit layout area 21 includes three areas. Hence, the first metal layer 61 is formed respectively in these three areas as a first metal layer the first area 611, a first metal layer the second area 612 and a first metal layer the third area 613. The first circuit layout area 21 and the second circuit layout area 22 intersect at an intersection area 31. An adjacent crossover area 33 is defined to include the intersection area 31 and a peripheral adjacent area 32 of the intersection area 31. In current embodiment, the intersection area 31 includes three areas: an intersection area the first area 311, an intersection area the second area 312 and an intersection area the third area 313. Since these three intersection areas 31 are very close in distance, hence, these multiple intersection areas 31 and the peripheral adjacent areas 32 of these multiple intersection areas 31 form the adjacent crossover area 33 as shown in the FIG. 1P. In current embodiment, the adjacent crossover area 33 is a combination of areas including the intersection area the first area 311, the intersection area the second area 312, the intersection area the third area 313, the peripheral adjacent area of the intersection area the first area 311, the peripheral adjacent area of the intersection area the second area 312 and the peripheral adjacent area of the intersection area the third area 313. A first dielectric area 41 (the thick border frame area) is defined on the top surface of the compound semiconductor substrate 10 (not shown in the Figure), wherein the first dielectric area 41 is located within the adjacent crossover area 33, and the first dielectric area 41 intersects with at least part of the intersection area 31 (in current embodiment, the first dielectric area 41 includes the intersection area the first area 311, the intersection area the second area 312 and the intersection area the third area 313). The area outside the first dielectric area 41 (the thick border frame area) on the top surface of the compound semiconductor substrate 10 (not shown in the Figure) is defined as a second dielectric area 42. A low dielectric block 50 made of a low dielectric material is formed on the compound semiconductor substrate 10 (not shown in the Figure) and the first metal layer 61. In current embodiment, the low dielectric block 50 is formed only within the first dielectric area 41 (the thick border frame area), but there is no low dielectric block 50 in the second dielectric area 42. The low dielectric block 50 within the first dielectric area 41 is defined as a first dielectric block 51. The first dielectric block 51 has a thickness 53 (not shown in the Figure). Hence, in current embodiment, there is only the first dielectric block 51 (the thick border frame area), but no "second dielectric block 52". A second metal layer 62 is formed within the second circuit layout area 22. In current embodiment, the second metal layer 62 is formed on the first dielectric block 51 and the compound semiconductor substrate 10. Furthermore, there is a variation of current embodiment. The main structure of the variation is mostly similar to the structure of current embodiment, except that the low dielectric block 50 is formed within both the first dielectric area 41 and the second dielectric area 42. The low dielectric block 50 within the second dielectric area 42 is defined as a second dielectric block 52. The second dielectric block 52 has a thickness 54 (not shown in the Figure). The thickness 54 (not shown in the Figure) of at least part of the second dielectric block 52 is smaller than the thickness 53 (not shown in the Figure) of the first dielectric block 51. The second metal layer 62 is formed on the first dielectric block 51 and the second dielectric block 52.

Please refer to FIG. 1Q, which shows the top view of another embodiment of a layout method for compound semiconductor integrated circuits of the present invention. In current embodiment, the first circuit layout area 21 includes two areas. Hence, the first metal layer 61 is formed respectively in these two areas: a first metal layer the first area 611 and a first metal layer the second area 612. The first circuit layout area 21 and the second circuit layout area 22 intersect at an intersection area 31. An adjacent crossover area 33 is defined to include the intersection area 31 and a peripheral adjacent area 32 of the intersection area 31. In current embodiment, the intersection area 31 includes two areas: an intersection area the first area 311 and an intersection area the second area 312. Since these two intersection areas 31 are very close in distance, hence these two intersection areas 31 and the peripheral adjacent areas 32 of these two intersection areas 31 form the adjacent crossover area 33 as shown in the FIG. 1Q. In current embodiment, the adjacent crossover area 33 is a combination of areas including the intersection area the first area 311, the intersection area the second area 312, the peripheral adjacent area of the intersection area the first area 311 and the peripheral adjacent area of the intersection area the second area 312. A first dielectric area 41 (the thick border frame area) is defined on the top surface of the compound semiconductor substrate 10 (not shown in the Figure), wherein the first dielectric area 41 is located within the adjacent crossover area 33, and the first dielectric area 41 intersects with at least part of the intersection area 31 (in current embodiment, the first dielectric area 41 includes the intersection area the first area 311 and the intersection area the second area 312).

Figure 2:
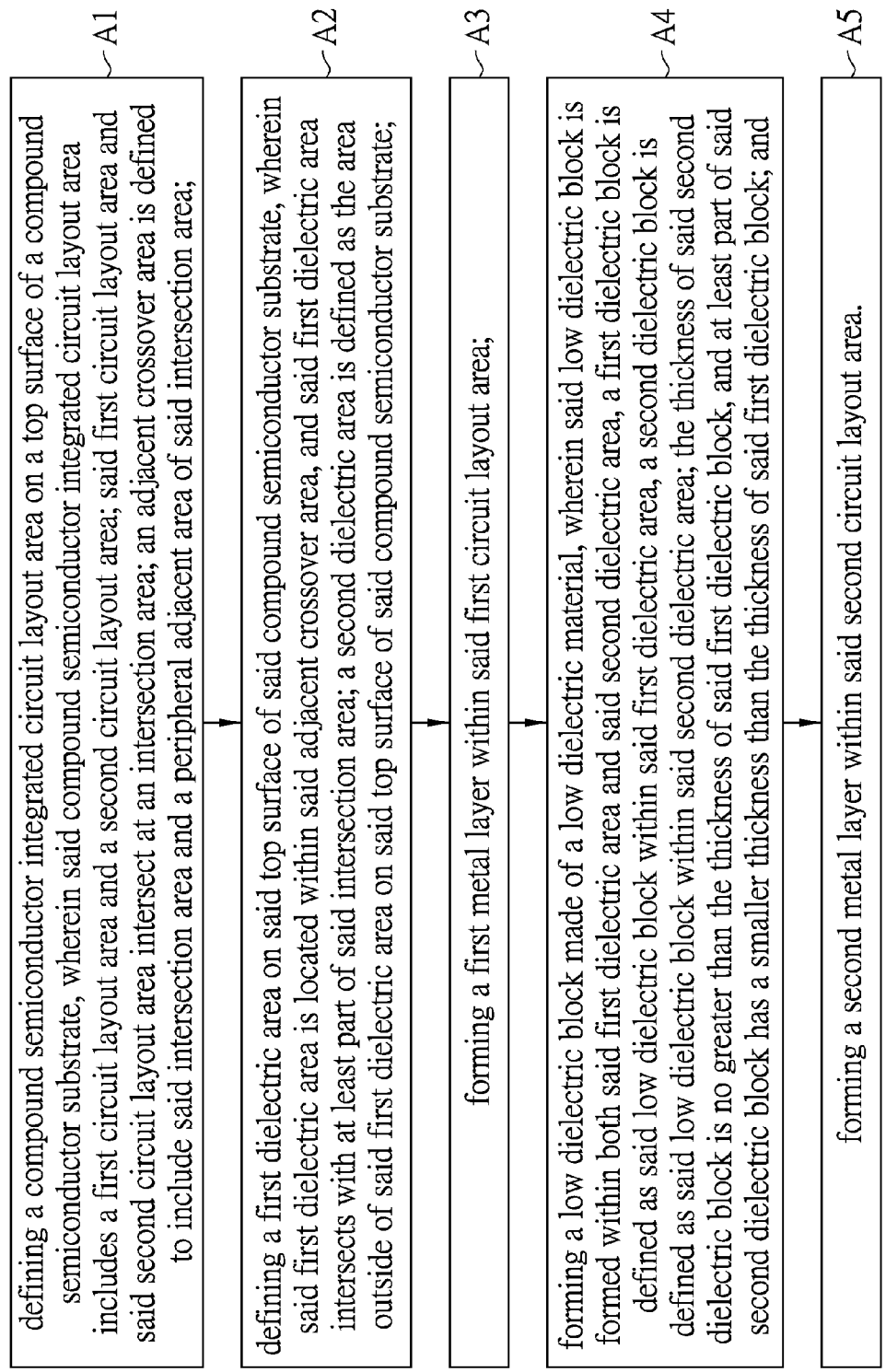
FIG. 2 shows the flow diagram of an embodiment of a layout method for compound semiconductor integrated circuits of the present invention.

Please refer to FIG. 2, which shows the flow diagram of an embodiment of a layout method for compound semiconductor integrated circuits of the present invention. The layout method comprises following steps of: (please also referring to FIGS. 1, 1A, 1D, 1E, 1H, 1I, 1L and 1M) A1: defining a compound semiconductor integrated circuit layout area 1 on a top surface of a compound semiconductor substrate 10, wherein the compound semiconductor integrated circuit layout area 1 includes a first circuit layout area 21 and a second circuit layout area 22; the first circuit layout area 21 and the second circuit layout area 22 intersect at an intersection area 31; an adjacent crossover area 33 is defined to include the intersection area 31 and a peripheral adjacent area 32 of the intersection area 31; A2: defining a first dielectric area 41 (the thick border frame area) on the top surface of the compound semiconductor substrate 10, wherein the first dielectric area 41 is located within the adjacent crossover area 33, and the first dielectric area 41 intersects with at least part of the intersection area 31; a second dielectric area 42 is defined as the area outside the first dielectric area 41 on the top surface of the compound semiconductor substrate 10; A3: forming a first metal layer 61 within the first circuit layout area 21; A4: forming a low dielectric block 50 made of a low dielectric material, wherein the low dielectric block 50 is formed within both the first dielectric area 41 and the second dielectric area 42 (referring to FIGS. 1 and 1A), a first dielectric block 51 is defined as the low dielectric block 50 within the first dielectric area 41 (the thick border frame area); the first dielectric block 51 has a thickness 53; a second dielectric block 52 is defined as the low dielectric block 50 within the second dielectric area 42; the second dielectric block 52 has a thickness 54; the thickness 54 of the second dielectric block 52 is no greater than the thickness 53 of the first dielectric block 51, and the thickness 54 of at least part of the second dielectric block 52 is smaller than the thickness 53 of the first dielectric block 51 (referring to FIGS. 1 and 1A); and A5: forming a second metal layer 62 within the second circuit layout area 22; so as to enhance the moisture resistance ability of the compound semiconductor integrated circuit 1.

Figure 2A:
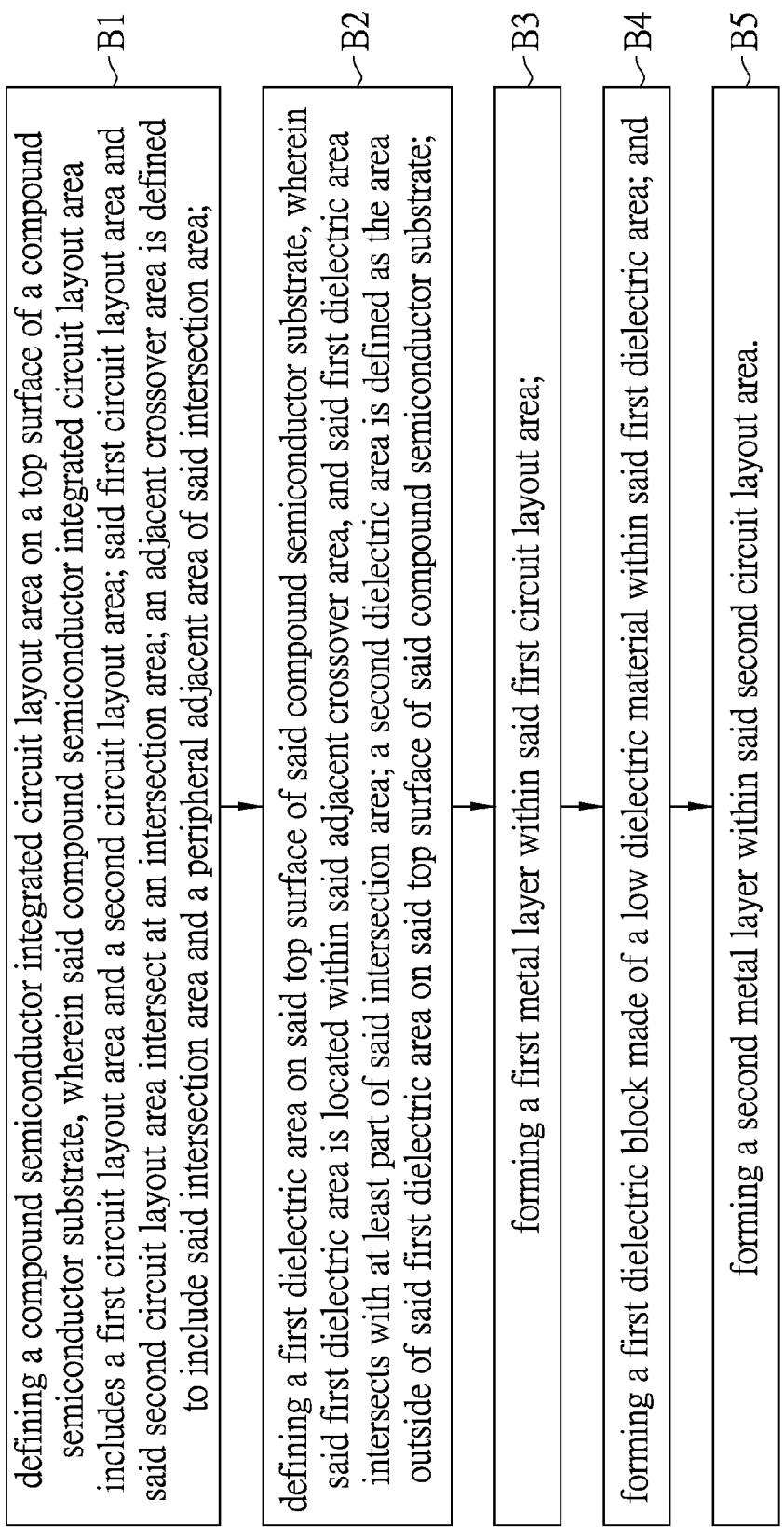
FIG. 2A shows the flow diagram of another embodiment of a layout method for compound semiconductor integrated circuits of the present invention.

Please refer to FIG. 2A, which shows the flow diagram of another embodiment of a layout method for compound semiconductor integrated circuits of the present invention. The layout method comprises following steps of: (please also referring to FIGS. 1B, 1C, 1F, 1Q 1J, 1K, 1N and 1O) B1: defining a compound semiconductor integrated circuit layout area 1 on a top surface of a compound semiconductor substrate 10, wherein the compound semiconductor integrated circuit layout area 1 includes a first circuit layout area 21 and a second circuit layout area 22; the first circuit layout area 21 and the second circuit layout area 22 intersect at an intersection area 31; an adjacent crossover area 33 is defined to include the intersection area 31 and a peripheral adjacent area 32 of the intersection area 31; B2: defining a first dielectric area 41 (the thick border frame area) on the top surface of the compound semiconductor substrate 10, wherein the first dielectric area 41 is located within the adjacent crossover area 33, and the first dielectric area 41 intersects with at least part of the intersection area 31; a second dielectric area 42 is defined as the area outside the first dielectric area 41 on the top surface of the compound semiconductor substrate 10; B3: forming a first metal layer 61 within the first circuit layout area 21; B4: forming a first dielectric block 51 made of a low dielectric material within the first dielectric area 41 (referring to FIGS. 1B and 1C, the thick border frame area); the first dielectric block 51 has a thickness 53; and B5: forming a second metal layer 62 within the second circuit layout area 22; so as to enhance the moisture resistance ability of the compound semiconductor integrated circuit 1.

Figure 2B:
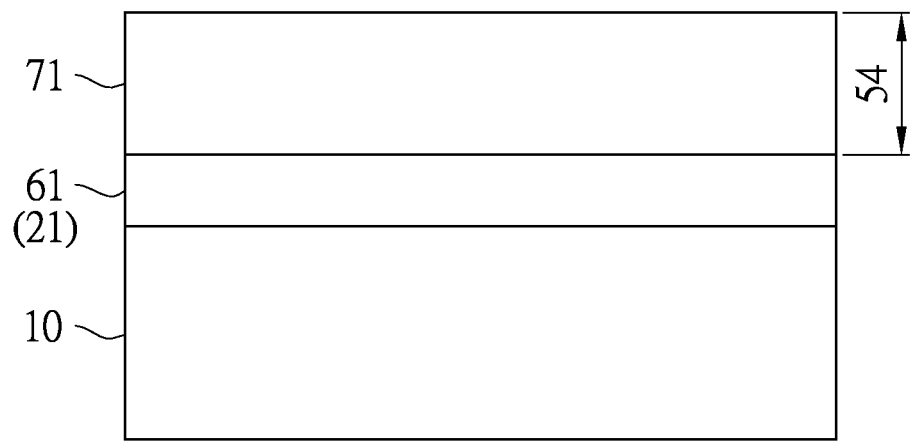
FIG. 2B-2G show the cross-sectional schematic views of the process steps of the embodiments of a layout method for compound semiconductor integrated circuits of the present invention.
Figure 2C:
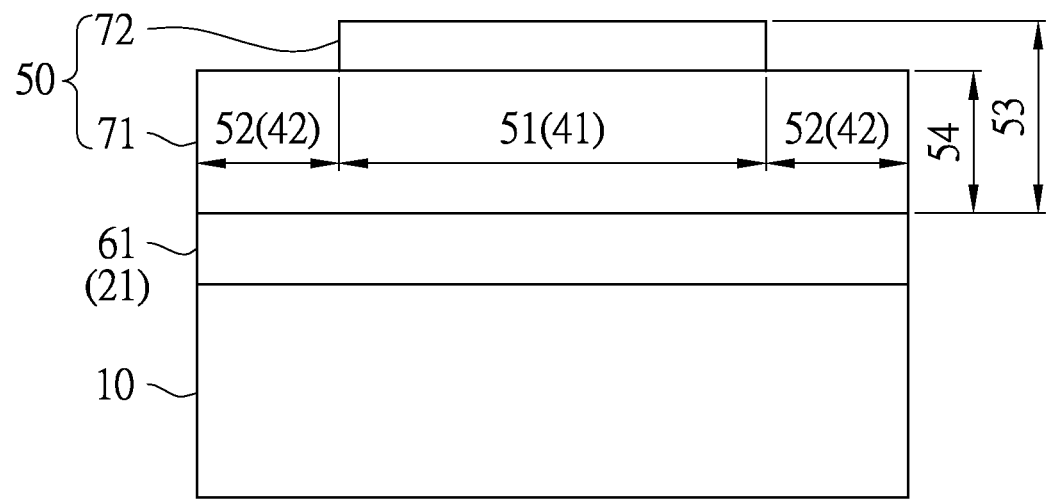

Please refer to FIGS. 2B and 2C, which show the cross-sectional schematic views of the process steps of an embodiment of a layout method for compound semiconductor integrated circuits of the present invention. In an embodiment, the A4 step of forming the low dielectric block 50 comprises following steps of: (referring to FIG. 2B) forming a first low dielectric layer 71 within both the first dielectric area 41 and the second dielectric area 42, wherein the thickness of the first low dielectric layer 71 is equal to the thickness 54 of the second dielectric block 52; and (referring to FIG. 2C) forming a second low dielectric layer 72 within the first dielectric area 41, wherein a sum of the thickness of the second low dielectric layer 72 and the thickness of the first low dielectric layer 71 (the thickness 54 of the second dielectric block 52) is equal to the thickness 53 of the first dielectric block 51. The first low dielectric layer 71 and the second low dielectric layer 72 have the same material as the low dielectric material of the low dielectric block 50.

Figure 2D:
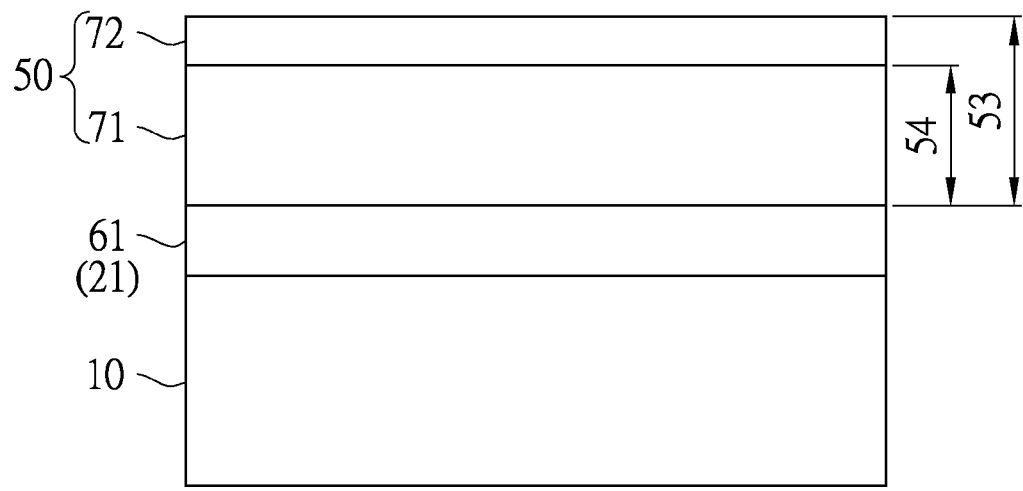

Please refer to FIGS. 2B, 2C and 2D, which show the cross-sectional schematic views of the process steps of an embodiment of a layout method for compound semiconductor integrated circuits of the present invention. In another embodiment, the A4 step of forming the low dielectric block 50 comprises following steps of: (referring to FIG. 2B) forming a first low dielectric layer 71 within both the first dielectric area 41 and the second dielectric area 42, wherein the thickness of the first low dielectric layer 71 is equal to the thickness 54 of the second dielectric block 52; (referring to FIG. 2D) forming a second low dielectric layer 72 within both the first dielectric area 41 and the second dielectric area 42, wherein a sum of the thickness of the first low dielectric layer 71 (equal to the thickness 54 of the second dielectric block 52) and the thickness of the second low dielectric layer 72 is equal to the thickness 53 of the first dielectric block 51; and (referring to FIG. 2C) removing the second low dielectric layer 72 within the second dielectric area 42 by using the exposure and development or etching such that there remains only the first low dielectric layer 71 within the second dielectric area 42, and the thickness of the first low dielectric layer 71 within the second dielectric area 42 is equal to the thickness 54 of the second dielectric block 52. The first low dielectric layer 71 and the second low dielectric layer 72 have the same material as the low dielectric material of the low dielectric block 50.

Figure 2E:
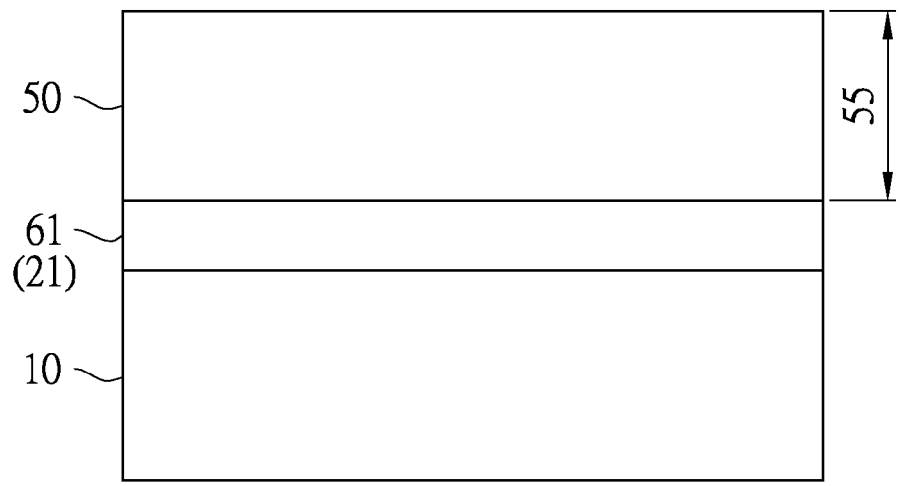
Figure 2F:
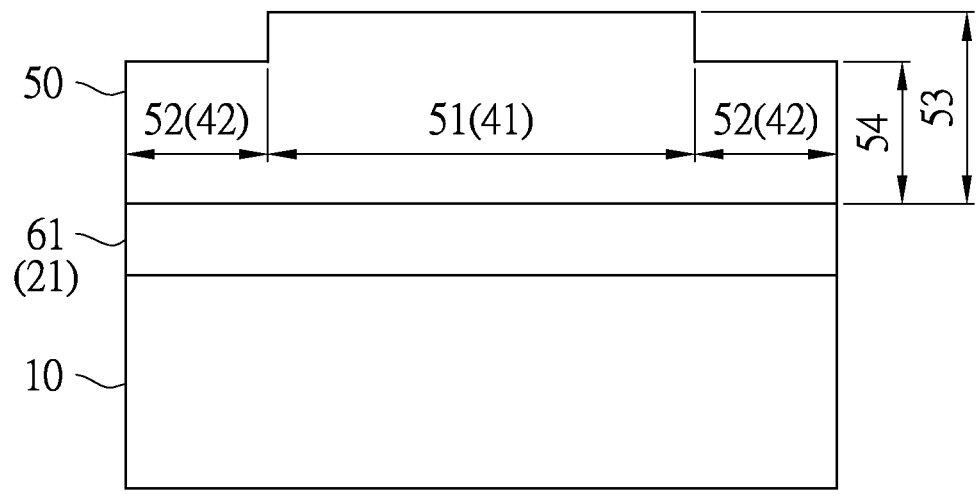

Please refer to FIGS. 2E and 2F, which show the cross-sectional schematic views of the process steps of an embodiment of a layout method for compound semiconductor integrated circuits of the present invention. In another embodiment, the A4 step of forming the low dielectric block 50 comprises following steps of: (referring to FIG. 2E) forming the low dielectric block 50 within both the first dielectric area 41 and the second dielectric area 42, wherein the thickness 55 of the low dielectric block 50 is equal to the thickness 53 of the first dielectric block 51; and (referring to FIG. 2F) removing the low dielectric block 50 within the second dielectric area 42 by using the exposure and development or etching, such that the thickness of the low dielectric block 50 within the first dielectric area 41 is equal to the thickness 53 of the first dielectric block 51, and the thickness of the low dielectric block 50 within the second dielectric area 42 is equal to the thickness 54 of the second dielectric block 52.

Please refer to FIGS. 2E and 2F, which show the cross-sectional schematic views of the process steps of an embodiment of a layout method for compound semiconductor integrated circuits of the present invention. In another embodiment, the A4 step of forming the low dielectric block 50 comprises following steps of: (referring to FIG. 2E) forming the low dielectric block 50 within both the first dielectric area 41 and the second dielectric area 42, wherein the thickness 55 of the low dielectric block 50 is greater than the thickness 53 of the first dielectric block 51; and (referring to FIG. 2F) removing the low dielectric block 50 within both the first dielectric area 41 and the second dielectric area 42 by using the exposure and development or etching, such that the thickness of the low dielectric block 50 within the first dielectric area 41 is equal to the thickness 53 of the first dielectric block 51, and the thickness of the low dielectric block 50 within the second dielectric area 42 is equal to the thickness 54 of the second dielectric block 52.

Figure 2G:
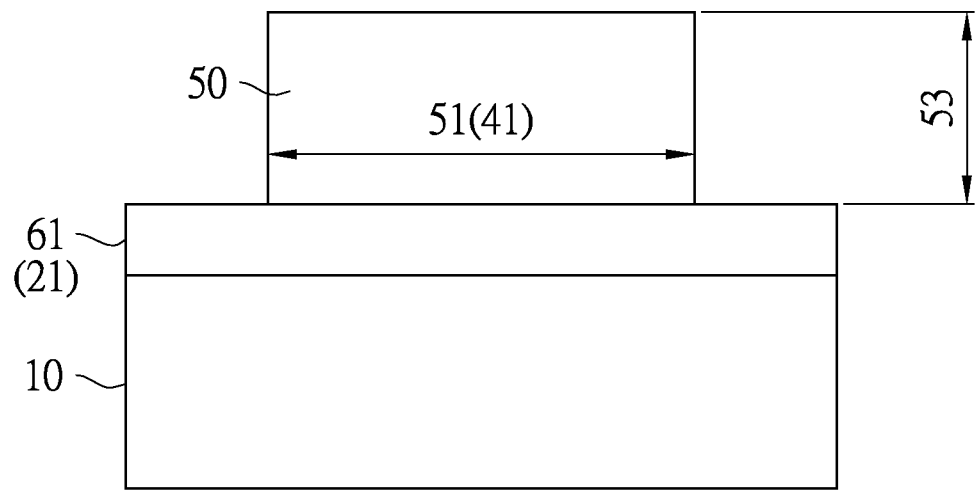

Please refer to FIGS. 2E and 2Q which show the cross-sectional schematic views of the process steps of an embodiment of a layout method for compound semiconductor integrated circuits of the present invention. In another embodiment, the B4 step of forming the first dielectric block 51 comprises following steps of: (referring to FIG. 2E) forming the low dielectric block 50 within both the first dielectric area 41 and the second dielectric area 42, wherein the thickness 55 of the low dielectric block 50 is equal to the thickness 53 of the first dielectric block 51; and (referring to FIG. 2G) removing the low dielectric block 50 within the second dielectric area 42 by using the exposure and development or etching, such that the thickness of the low dielectric block 50 within the first dielectric area 41 is equal to the thickness 53 of the first dielectric block 51, and the thickness of the low dielectric block 50 within the second dielectric area 42 is equal to zero.

Please refer to FIGS. 2E and 2Q which show the cross-sectional schematic views of the process steps of an embodiment of a layout method for compound semiconductor integrated circuits of the present invention. In another embodiment, the B4 step of forming the first dielectric block 51 comprises following steps of: (referring to FIG. 2E) forming the low dielectric block 50 within both the first dielectric area 41 and the second dielectric area 42, wherein the thickness 55 of the low dielectric block 50 is greater than the thickness 53 of the first dielectric block 51; and (referring to FIG. 2G) by using the exposure and development or etching the low dielectric block 50 within the first dielectric area 41, and removing the low dielectric block 50 within the second dielectric area 42 by using the exposure and development or etching, such that the thickness of the low dielectric block 50 within the first dielectric area 41 is equal to the thickness 53 of the first dielectric block 51, and the thickness of the low dielectric block 50 within the second dielectric area 42 is equal to zero.

Figure 2H:
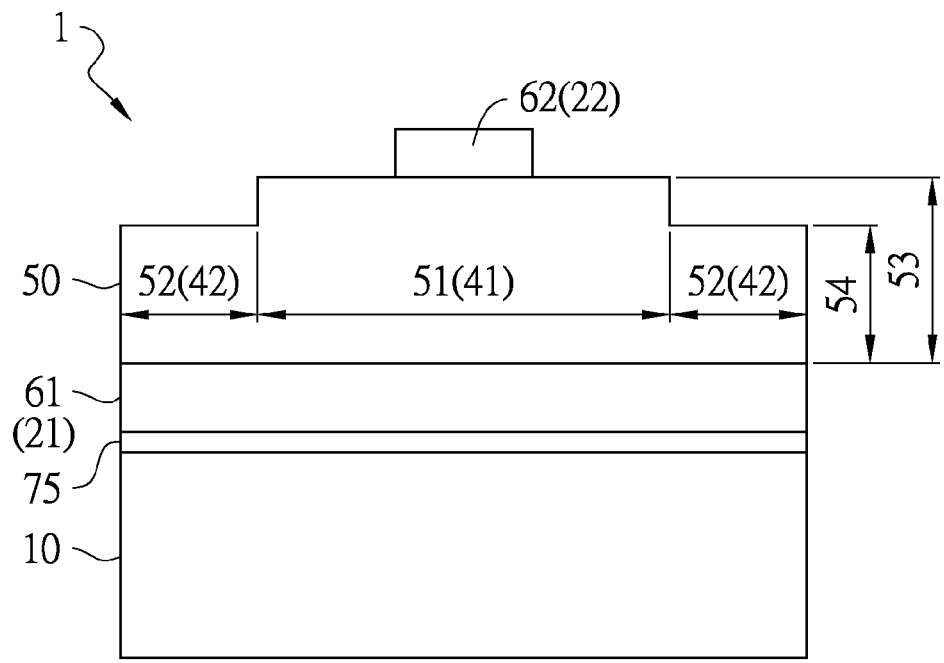
FIG. 2H shows the cross-sectional view of an embodiment of a layout method for compound semiconductor integrated circuits of the present invention.

Please refer to FIG. 2H, which shows the cross-sectional view of an embodiment of a layout method for compound semiconductor integrated circuits of the present invention. The main structure is mostly similar to the structure of the embodiment shown in FIGS. 1 and 1A, except that it further comprises a lower insulating layer 75 formed on the compound semiconductor substrate 10, and the lower insulating layer 75 is formed below the first metal layer 61 and the low dielectric block 50. The lower insulating layer 75 is made of at least one material selected from the group consisting of SiN and $SiO_2$. The layout method is mostly similar to that of the embodiment shown in FIG. 2, except that before the step of A3 it further comprises a step of forming a lower insulating layer 75, such that the lower insulating layer 75 is formed on the compound semiconductor substrate 10, and the lower insulating layer 75 is formed below the first metal layer 61 and the low dielectric block 50. In another embodiment, the structure may comprise a plural of lower insulating layers 75 (not shown in the Figure).

Figure 2I:
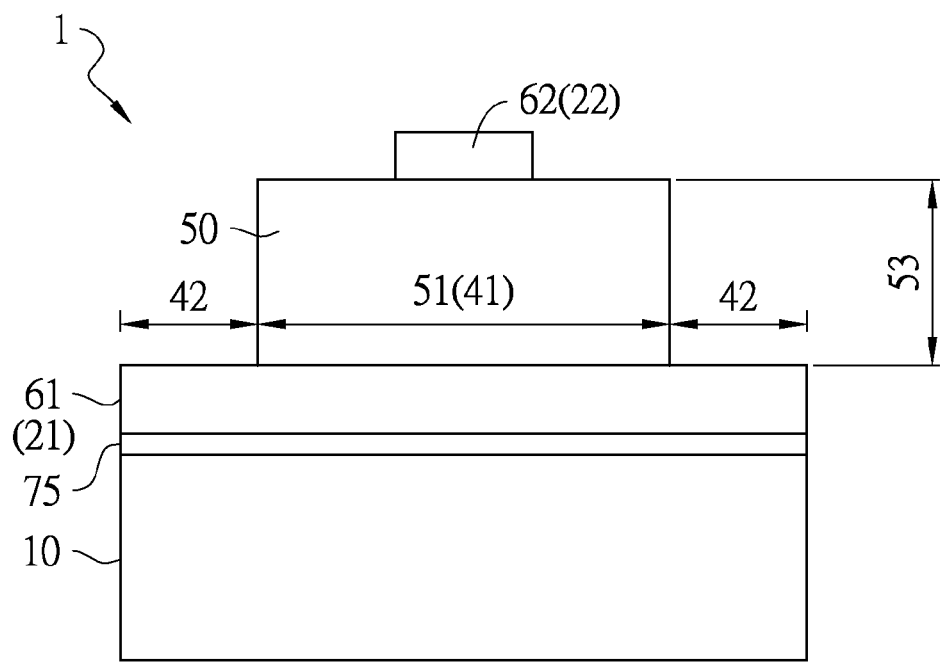
FIG. 2I shows the cross-sectional view of an embodiment of a layout method for compound semiconductor integrated circuits of the present invention.

Please refer to FIG. 2I, which shows the cross-sectional view of an embodiment of a layout method for compound semiconductor integrated circuits of the present invention. The main structure is mostly similar to the structure of the embodiment shown in FIG. 2H, except that the low dielectric block 50 is formed only within the first dielectric area 41, but there is no low dielectric block 50 in the second dielectric area 42. Hence, in current embodiment, there is only the first dielectric block 51, but no "second dielectric block 52". In another embodiment, the structure may comprise a plural of lower insulating layers 75 (not shown in the Figure). The layout method is mostly similar to that of the embodiment shown in FIG. 2A, except that before the step of B3 it further comprises a step of forming a lower insulating layer 75, such that the lower insulating layer 75 is formed on the compound semiconductor substrate 10, and the lower insulating layer 75 is formed below the first metal layer 61 and the first dielectric block 51.

Figure 2J:
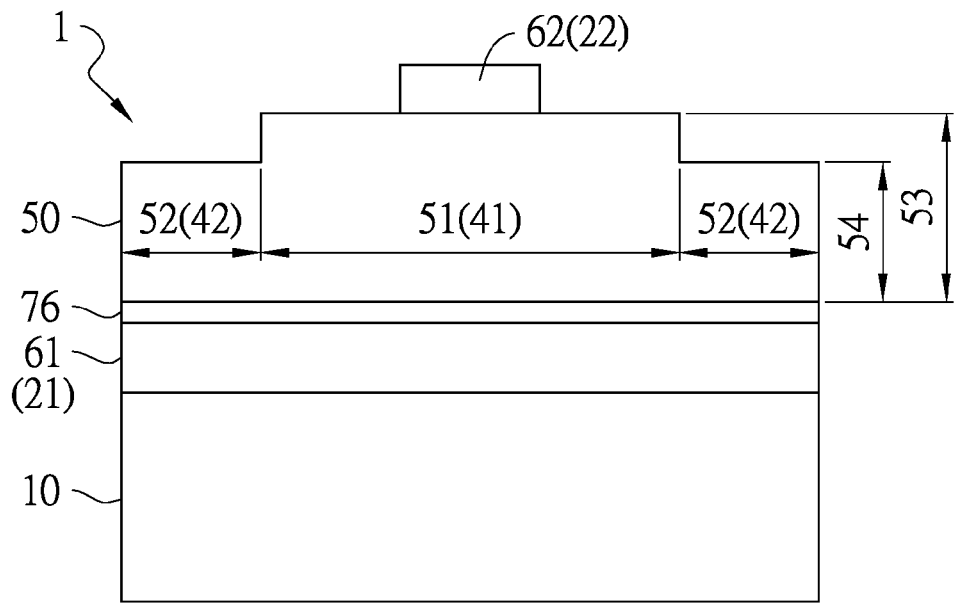
FIG. 2J shows the cross-sectional view of an embodiment of a layout method for compound semiconductor integrated circuits of the present invention.

Please refer to FIG. 2J, which shows the cross-sectional view of an embodiment of a layout method for compound semiconductor integrated circuits of the present invention. The main structure is mostly similar to the structure of the embodiment shown in FIGS. 1 and 1A, except that it further comprises an upper insulating layer 76 formed on the compound semiconductor substrate 10 and the first metal layer 61, and the upper insulating layer 76 is formed below the low dielectric block 50. The upper insulating layer 76 is made of at least one material selected from the group consisting of SiN and $SiO_2$. The layout method is mostly similar to that of the embodiment shown in FIG. 2, except that between the step of A3 and the step of A4 it further comprises a step of forming an upper insulating layer 76, such that the upper insulating layer 76 is formed on the compound semiconductor substrate 10 and the first metal layer 61, and the upper insulating layer 76 is formed below the low dielectric block 50. In another embodiment, the structure may comprise a plural of upper insulating layers 76 (not shown in the Figure).

Figure 2K:
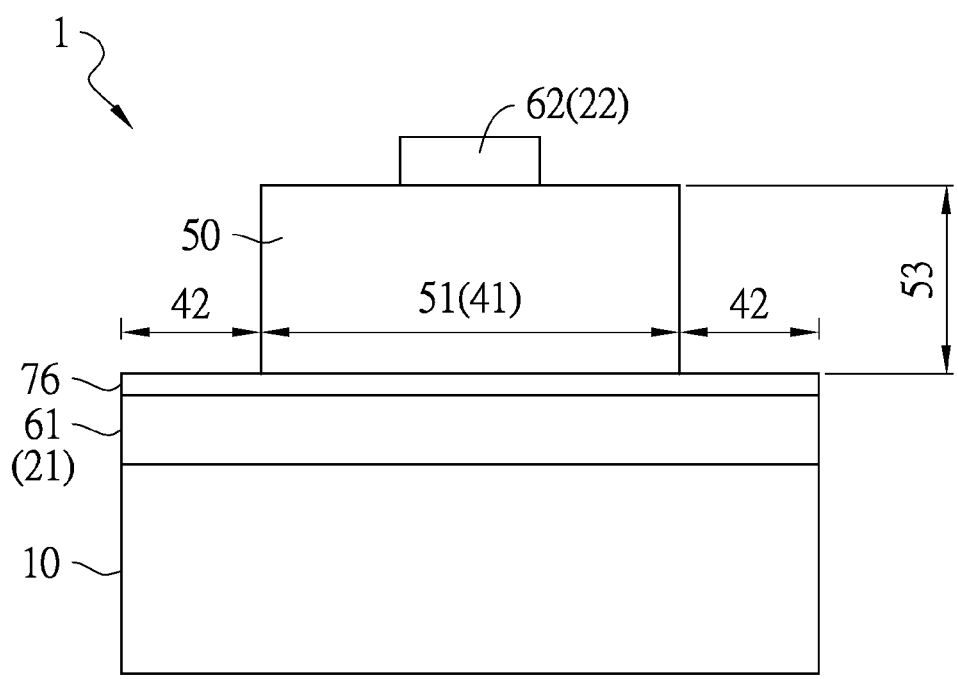
FIG. 2K shows the cross-sectional view of an embodiment of a layout method for compound semiconductor integrated circuits of the present invention.

Please refer to FIG. 2K, which shows the cross-sectional view of an embodiment of a layout method for compound semiconductor integrated circuits of the present invention. The main structure is mostly similar to the structure of the embodiment shown in FIG. 2J, except that the low dielectric block 50 is formed only within the first dielectric area 41, but there is no low dielectric block 50 in the second dielectric area 42. Hence, in current embodiment, there is only the first dielectric block 51, but no "second dielectric block 52". In another embodiment, the structure may comprise a plural of upper insulating layers 76 (not shown in the Figure). The layout method is mostly similar to that of the embodiment shown in FIG. 2A, except that between the step of B3 and the step of B4 it further comprises a step of forming an upper insulating layer 76, such that the upper insulating layer 76 is formed on the compound semiconductor substrate 10 and the first metal layer 61, and the upper insulating layer 76 is formed below the first dielectric block 51.

Figure 2L:
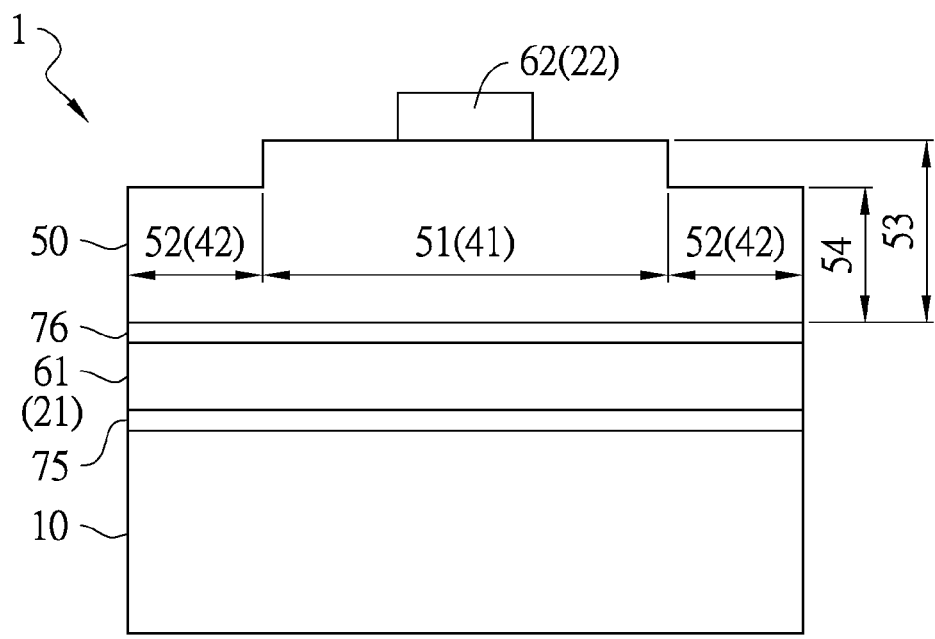
FIG. 2L shows the cross-sectional view of an embodiment of a layout method for compound semiconductor integrated circuits of the present invention.

Please refer to FIG. 2L, which shows the cross-sectional view of an embodiment of a layout method for compound semiconductor integrated circuits of the present invention. The main structure is mostly similar to the structure of the embodiment shown in FIG. 2J, except that it further comprises a lower insulating layer 75 formed on the compound semiconductor substrate 10, and the lower insulating layer 75 is formed below the first metal layer 61 and the low dielectric block 50. The lower insulating layer 75 is made of at least one material selected from the group consisting of SiN and $SiO_2$. The layout method is mostly similar to that of the embodiment shown in FIG. 2J, except that before the step of A3 it further comprises a step of forming a lower insulating layer 75, such that the lower insulating layer 75 is formed on the compound semiconductor substrate 10, and the lower insulating layer 75 is formed below the first metal layer 61 and the low dielectric block 50. In another embodiment, the structure may comprise a plural of upper insulating layers 76 (not shown in the Figure). In another embodiment, the structure may comprise a plural of lower insulating layers 75 (not shown in the Figure). In another embodiment, the structure may comprise a plural of upper insulating layers 76 (not shown in the Figure) and a plural of lower insulating layers 75 (not shown in the Figure).

Figure 2M:
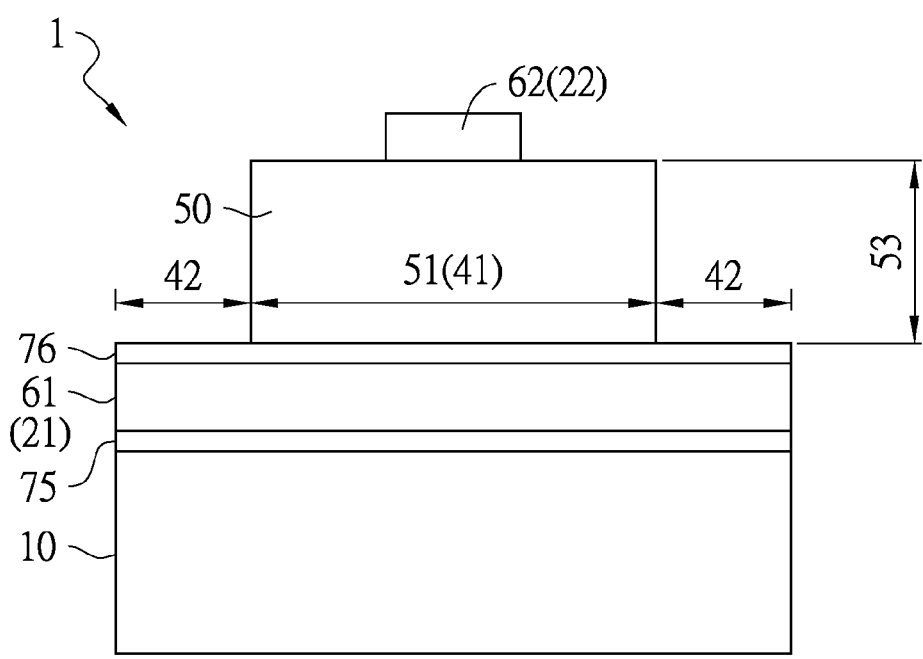
FIG. 2M shows the cross-sectional view of an embodiment of a layout method for compound semiconductor integrated circuits of the present invention.

Please refer to FIG. 2M, which shows the cross-sectional view of an embodiment of a layout method for compound semiconductor integrated circuits of the present invention. The main structure is mostly similar to the structure of the embodiment shown in FIG. 2L, except that the low dielectric block 50 is formed only within the first dielectric area 41, but there is no low dielectric block 50 in the second dielectric area 42. Hence, in current embodiment, there is only the first dielectric block 51, but no "second dielectric block 52". In another embodiment, the structure may comprise a plural of upper insulating layers 76 (not shown in the Figure). In another embodiment, the structure may comprise a plural of lower insulating layers 75 (not shown in the Figure). In another embodiment, the structure may comprise a plural of upper insulating layers 76 (not shown in the Figure) and a plural of lower insulating layers 75 (not shown in the Figure). The layout method is mostly similar to that of the embodiment shown in FIG. 2K, except that before the step of B3 it further comprises a step of forming a lower insulating layer 75, such that the lower insulating layer 75 is formed on the compound semiconductor substrate 10, and the lower insulating layer 75 is formed below the first metal layer 61 and the first dielectric block 51.

Figure 3:
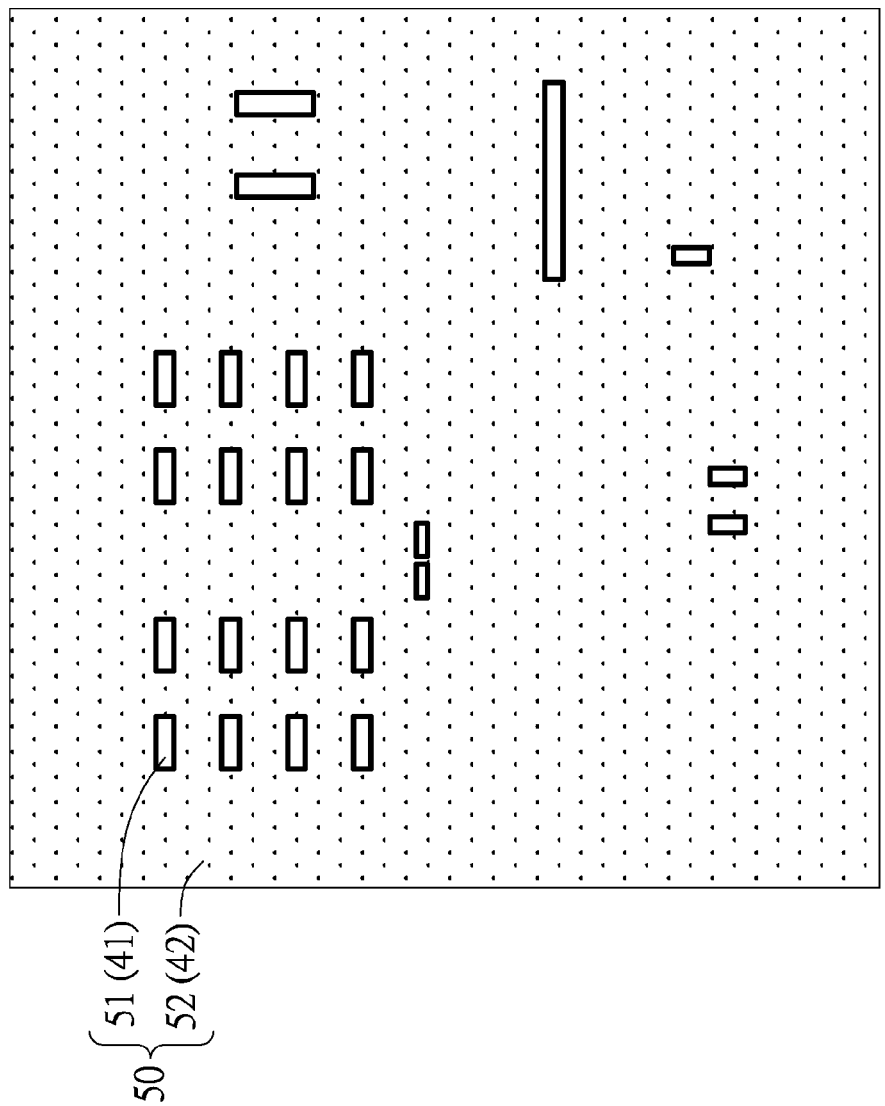
FIG. 3 shows the top schematic view of an embodiment of a layout method for compound semiconductor integrated circuits of the present invention.

Please refer to FIG. 3, which shows the top schematic view of an embodiment of a layout method for compound semiconductor integrated circuits of the present invention. Forming a low dielectric block 50 on a chip of a compound semiconductor integrated circuit 1 within both a first dielectric area 41 (the thick border frame area) and a second dielectric area 42, wherein the low dielectric block 50 within the first dielectric area 41 is defined as a first dielectric block 51 (the thick border frame area), the low dielectric block 50 within the second dielectric area 42 is defined as a second dielectric block 52, the first dielectric block 51 has a thickness 53 (not shown in the Figure), the second dielectric block 52 has a thickness 54 (not shown in the Figure), and the thickness 54 of at least part of the second dielectric block 52 is smaller than the thickness 53 of the first dielectric block 51. In current embodiment, the ratio of the area occupied by the second dielectric block 52 with respect to the area occupied by the first dielectric block 51 is very high. Hence, the thickness 54 of the second dielectric block 52 has the significant impact on the moisture resistance ability of the compound semiconductor integrated circuit 1. When the thickness 54 of at least part of the second dielectric block 52 is smaller than 90% of the thickness 53 of the first dielectric block 51, the moisture resistance ability of the compound semiconductor integrated circuit 1 may be enhanced. As the thickness 54 of the second dielectric block 52 is thinner, the enhancement of the moisture resistance ability of the compound semiconductor integrated circuit 1 is more obvious.

Figure 3A:
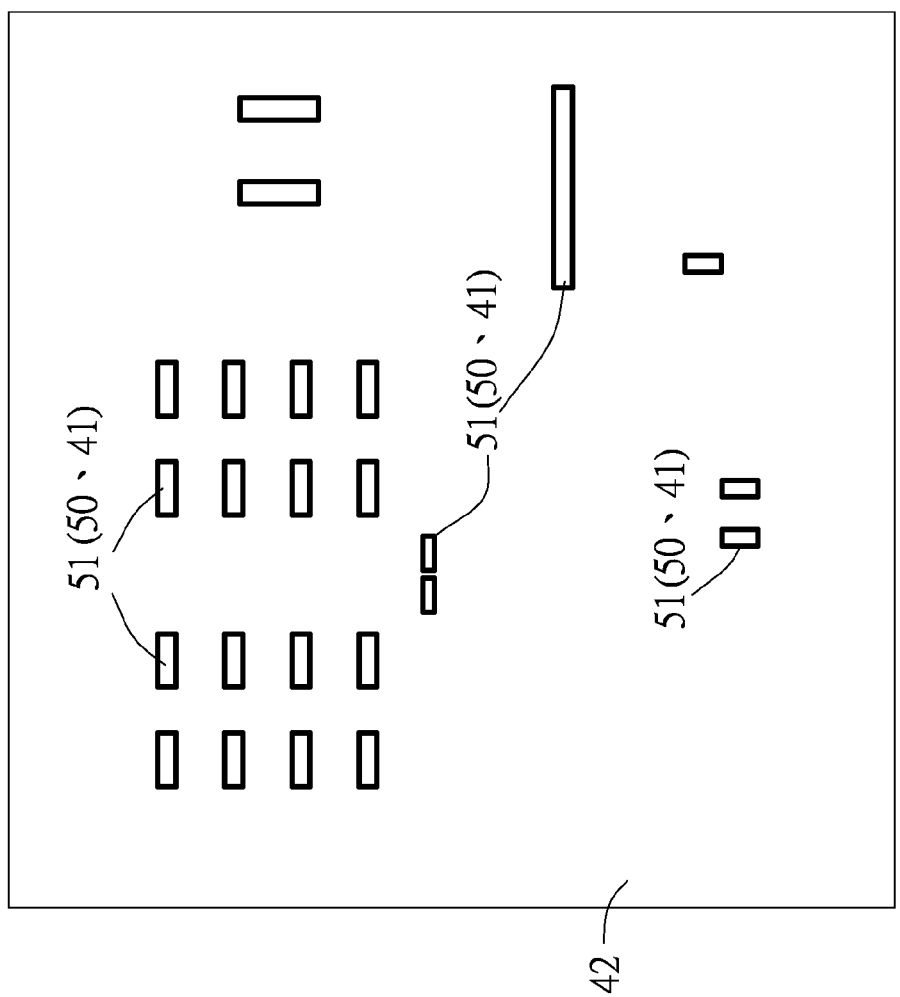
FIG. 3A shows the top schematic view of an embodiment of a layout method for compound semiconductor integrated circuits of the present invention.

Please refer to FIG. 3A, which shows the top schematic view of an embodiment of a layout method for compound semiconductor integrated circuits of the present invention. The main structure is mostly similar to the structure of the embodiment shown in FIG. 3, except that the low dielectric block 50 is formed on the chip of the compound semiconductor integrated circuit 1 only within the first dielectric area 41 (the thick border frame area). There is no low dielectric block 50 within the second dielectric area 42. The low dielectric block 50 within the first dielectric area 41 is defined as a first dielectric block 51 (the thick border frame area), wherein the first dielectric block 51 has a thickness 53 (not shown in the Figure). Hence, in current embodiment, there is only the first dielectric block 51 but no "second dielectric block 52". In the embodiment of FIG. 3A, the first metal layer (not shown in the Figure) is covered by the first dielectric block 51 since there is no "second dielectric block 52". The rest of the first metal layer (not shown in the Figure) is not covered by the low dielectric block 50. The current embodiment is the excellent embodiment of the present invention. It has excellent enhancement of the moisture resistance ability of the compound semiconductor integrated circuit 1 since there is only the first dielectric block 51 but no "second dielectric block 52".

Figure 3B:
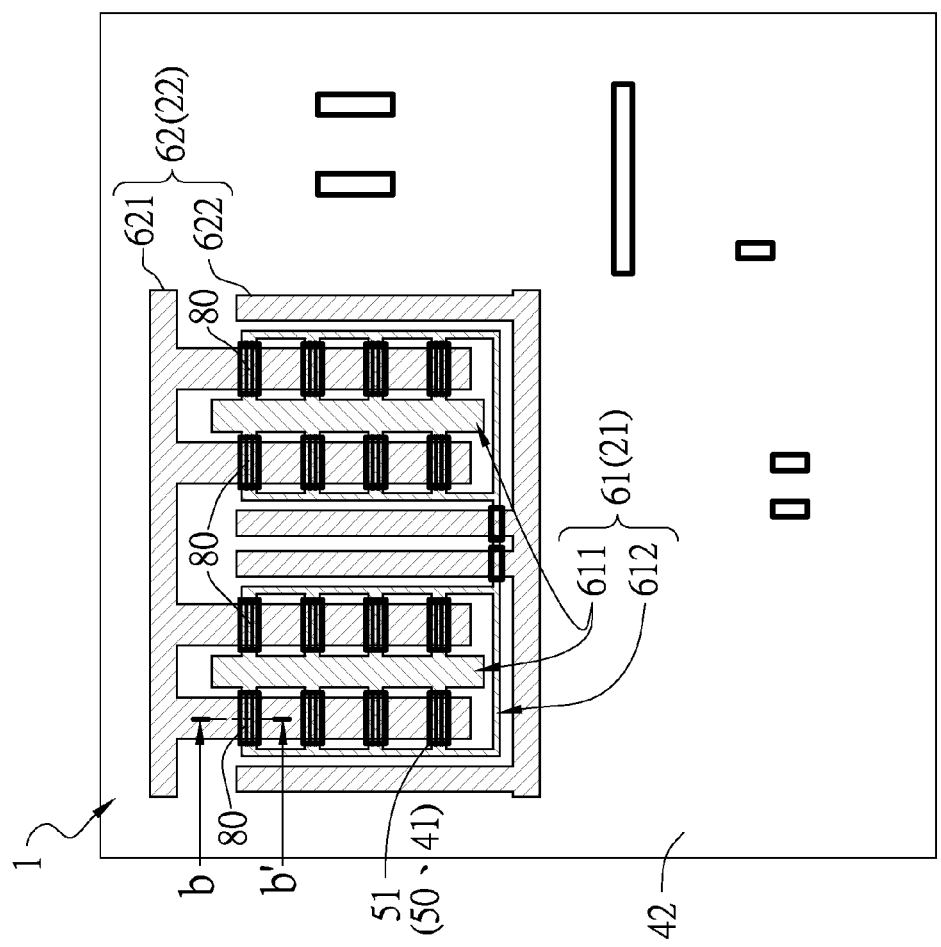
FIG. 3B illustrates the schematic view of the partial circuit diagram of FIG. 3A.
Figure 3C:
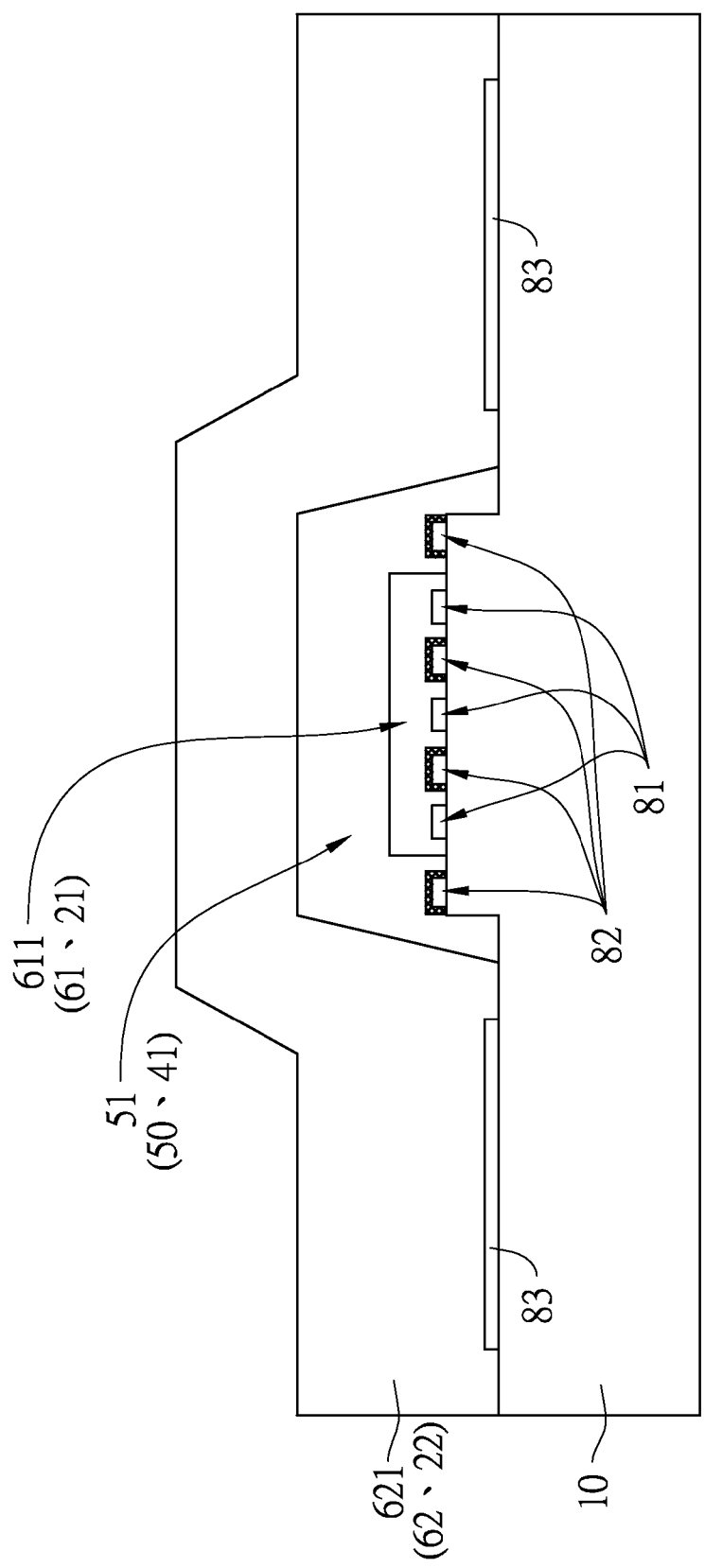
FIG. 3C shows the cross-sectional schematic view along the broken line b-b' in FIG. 3B.

Please refer to FIG. 3B, which illustrates the schematic view of the partial circuit diagram of FIG. 3A. A compound semiconductor integrated circuit 1 comprises a plural of heterojunction bipolar transistors (HBT) 80 formed on a compound semiconductor substrate 10. A first metal layer 61 is formed on the compound semiconductor substrate 10. The first metal layer 61 includes a first metal layer the first area 611 and a first metal layer the second area 612, wherein the first metal layer the first area 611 and the first metal layer the second area 612 are separated and not connected to each other. A first dielectric block 51 is formed within the first dielectric area 41 (the thick border frame area). In current embodiment, there is a plural of the first dielectric blocks 51 (the thick border frame area), while there is no second dielectric block 52 within the second dielectric area 42. The first dielectric block 51 is formed on the first metal layer 61. A second metal layer 62 is formed on the first dielectric block 51 and the compound semiconductor substrate 10. The second metal layer 62 includes a second metal layer the first area 621 and a second metal layer the second area 622, wherein the second metal layer the first area 621 and the second metal layer the second area 622 are separated and not connected to each other. Please also refer to FIG. 3C, which shows the cross-sectional schematic view along the broken line b-b' in FIG. 3B. In FIG. 3B, there is a plural of heterojunction bipolar transistors 80, wherein each of the heterojunction bipolar transistors 80 comprises an emitter electrode 81, a base electrode 82 and a collector electrode 83. The first metal layer the first area 611 is formed on the emitter electrode 81 of the heterojunction bipolar transistor 80 and electrically connected with the emitter electrode 81. The first metal layer the second area 612 is formed on the base electrode 82 of the heterojunction bipolar transistor 80 and electrically connected with the base electrode 82 (not shown in the Figure). The first dielectric block 51 is formed on the first metal layer the first area 611. The second metal layer the first area 621 is formed on the collector electrode 83 of the heterojunction bipolar transistor 80 and the first dielectric block 51 and electrically connected with the collector electrode 83. By the first dielectric block 51, the two layers having different potentials, the first metal layer 61 (the first metal layer the first area 611) and the second metal layer 62 (the second metal layer the first area 621), are isolated.

Figure 3D:
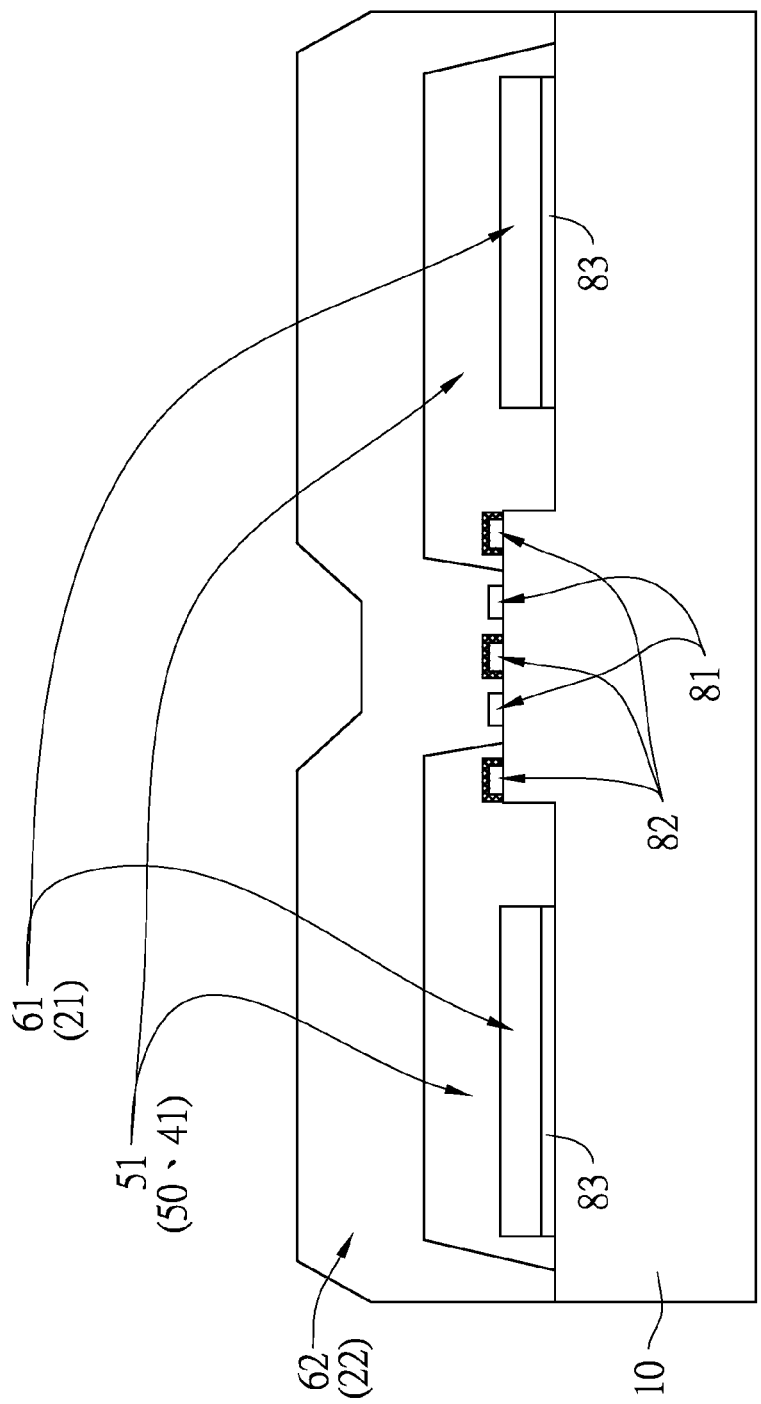
FIG. 3D shows the cross-sectional schematic view of the cross-sectional structure of an embodiment of a layout method for compound semiconductor integrated circuits of the present invention.

Please refer to FIG. 3D, which shows the cross-sectional schematic view of the cross-sectional structure of an embodiment of a layout method for compound semiconductor integrated circuits of the present invention. In FIG. 3D, a heterojunction bipolar transistor 80 is formed on a compound semiconductor substrate 10. The heterojunction bipolar transistor 80 comprises an emitter electrode 81, a base electrode 82 and a collector electrode 83. The first metal layer 61 is formed on the collector electrode 83 of the heterojunction bipolar transistor 80 and electrically connected with the collector electrode 83. A first dielectric block 51 is formed on the first metal layer 61. A second metal layer 62 is formed on the emitter electrode 81 of the heterojunction bipolar transistor 80, the first dielectric block 51 and the compound semiconductor substrate 10, and electrically connected with the emitter electrode 81. By the first dielectric block 51, the two layers having different potentials, the first metal layer 61 and the second metal layer 62, are isolated.

Figure 4:
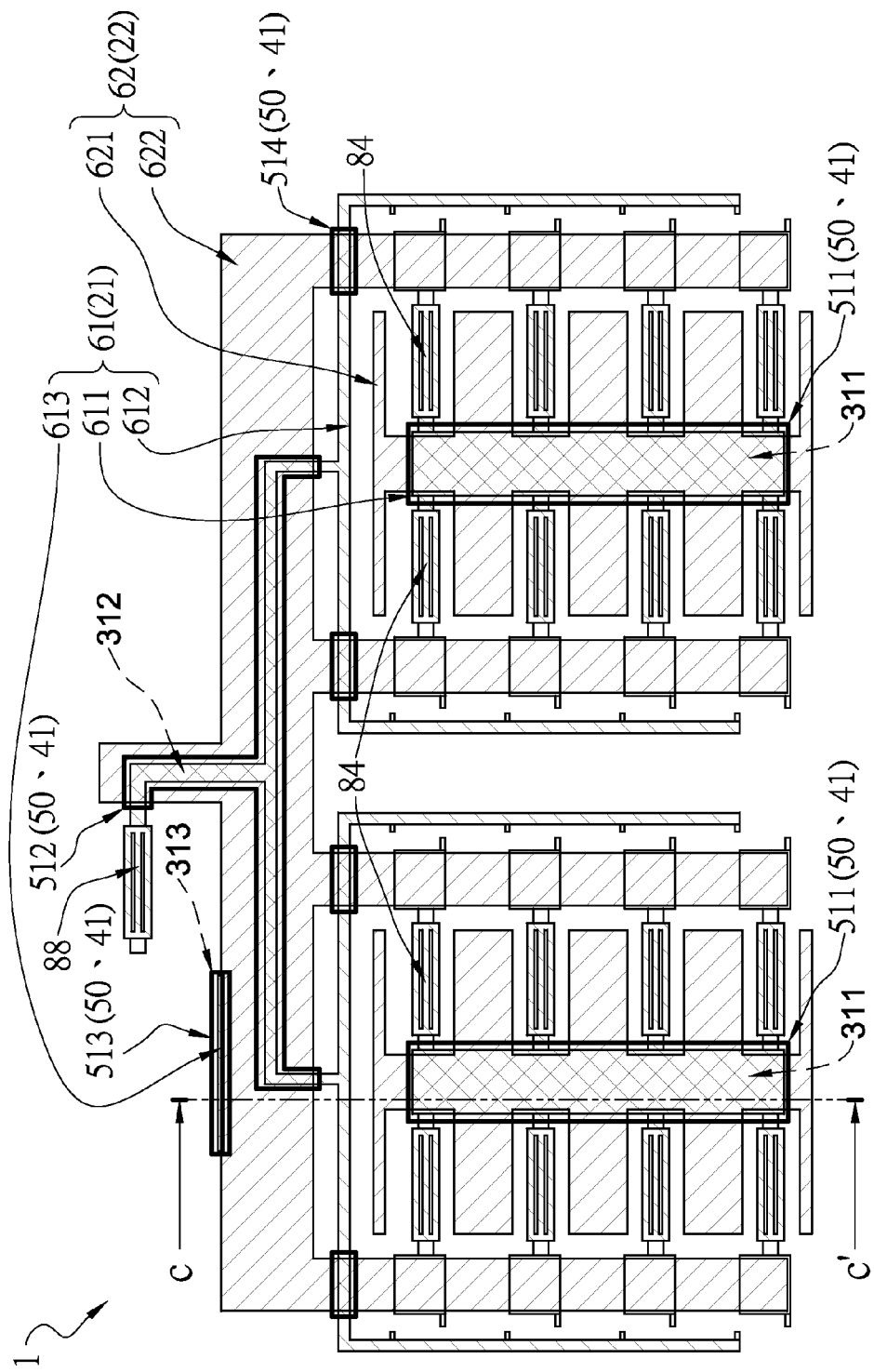
FIG. 4 shows the partial circuit layout schematic view of an embodiment of a layout method for compound semiconductor integrated circuits of the present invention.

Please refer to FIG. 4, which shows the partial circuit layout schematic view of an embodiment of a layout method for compound semiconductor integrated circuits of the present invention. Please also refer to FIG. 4A, which shows the partial circuit diagram of the corresponding embodiment of FIG. 4. A compound semiconductor integrated circuit 1 comprises a plural of heterojunction bipolar transistors (HBT) 84 and a bias circuit heterojunction bipolar transistor 88 formed on a compound semiconductor substrate 10 (not shown in the Figure). Each of the heterojunction bipolar transistors 84 comprises an emitter electrode 85, a base electrode 86 and a collector electrode 87. The bias circuit heterojunction bipolar transistor 88 comprises an emitter electrode 89, a base electrode 90 and a collector electrode 91. A first metal layer 61 is formed on the compound semiconductor substrate 10 (not shown in the Figure). The first metal layer 61 includes a first metal layer the first area 611, a first metal layer the second area 612 and a first metal layer the third area 613, wherein the first metal layer the first area 611, the first metal layer the second area 612 and the first metal layer the third area 613 are separated and not connected to each other. The first metal layer the first area 611 is electrically connected with the emitter electrode 85 of the heterojunction bipolar transistor 84. The first metal layer the second area 612 is electrically connected with the base electrode 86 of the heterojunction bipolar transistor 84. The first metal layer the third area 613 is electrically connected with the base electrode 90 of the bias circuit heterojunction bipolar transistor 88. A first dielectric block 51 (the thick border frame area) is formed within the first dielectric area 41, wherein the first dielectric block 51 includes two first dielectric block the first areas 511, a first dielectric block the second area 512, a first dielectric block the third area 513 and a plural of first dielectric block the fourth areas 514. In current embodiment, the area outside the first dielectric area 41 is defined as a second dielectric area 42 (not shown in the Figure). There is no "second dielectric block 52" within the second dielectric area 42. The first dielectric block 51 is formed on the first metal layer 61. A second metal layer 62 is formed on the first dielectric block 51 and the compound semiconductor substrate 10. The second metal layer 62 includes a second metal layer the first area 621 and a second metal layer the second area 622, wherein the second metal layer the first area 621 and the second metal layer the second area 622 are separated and not connected to each other. The second metal layer the first area 621 is electrically connected with the collector electrode 87 of the heterojunction bipolar transistor 84. The second metal layer the second area 622 is electrically connected with the collector electrode 91 of the bias circuit heterojunction bipolar transistor 88.

Figure 4A:
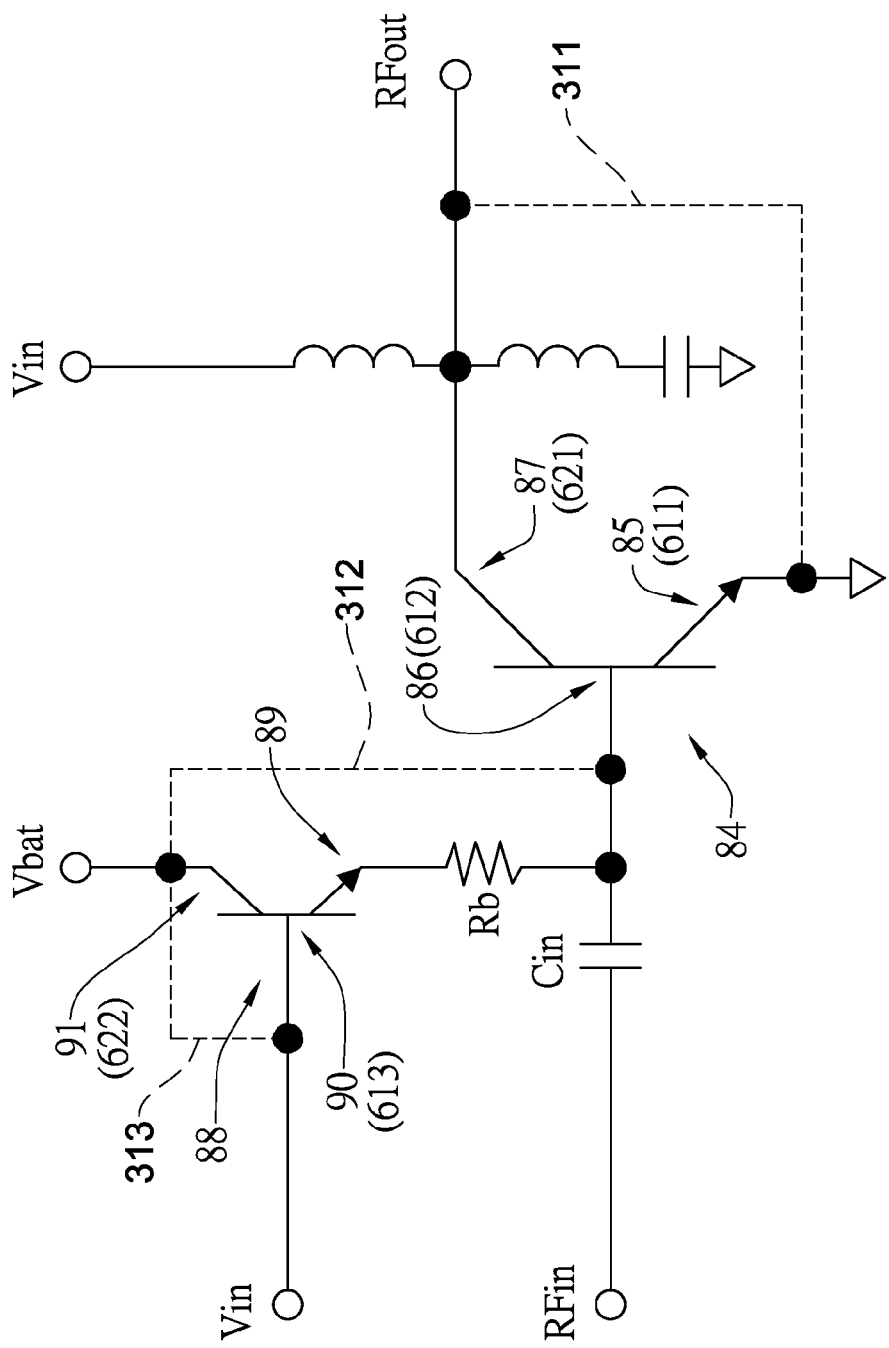
FIG. 4A shows the partial circuit diagram of the corresponding embodiment of FIG. 4.

In FIG. 4 and FIG. 4A, the first metal layer the first area 611 and the second metal layer the first area 621 intersect at two intersection area the first areas 311. The two layers having different potentials, first metal layer the first area 611 and the second metal layer the first area 621, form cross-connection by the first dielectric block the first areas 511 (the thick border frame area), thereby the first metal layer the first area 611 and the second metal layer the first area 621 are isolated. However the impedance of the compound semiconductor integrated circuit 1 at the intersection area the first area 311 and the peripheral adjacent area of the intersection area the first area 311 is affected by the thickness, area and shape of the first dielectric block the first areas 511 and a dielectric constant of a low dielectric material for forming the first dielectric block the first areas 511. Hence, the applicant of the present invention further developed the following: to make good use of the feature that the impedance of the compound semiconductor integrated circuit 1 at the intersection area the first area 311 and the peripheral adjacent area of the intersection area the first area 311 is affected by the first dielectric block the first areas 511, to design and adjust the thickness, area and shape of the first dielectric block the first areas 511 and choose the dielectric constant of the low dielectric material for forming the first dielectric block the first areas 511 in order to form the needed impedance (the impedance of the compound semiconductor integrated circuit 1 at the intersection area the first area 311 and the peripheral adjacent area of the intersection area the first area 311), so as to enhance the performance of the compound semiconductor integrated circuit 1. Hence, the layout method for compound semiconductor integrated circuits of the present invention, the step of forming the first dielectric block 51 further comprises following step of: according to the need of an impedance of the compound semiconductor integrated circuit 1 near the adjacent crossover area 33, deciding the thickness, the area and the shape of the first dielectric block 51 corresponding to the adjacent crossover area 33, and a dielectric constant of the low dielectric material to form the first dielectric block 51, so as to enhance the performance of the compound semiconductor integrated circuit 1.

In the embodiment of FIG. 4 and FIG. 4A, the heterojunction bipolar transistors 84 and the bias circuit heterojunction bipolar transistor 88 are the power amplifiers (the main power amplifiers) and the bias circuit power amplifier respectively. In other embodiments, the power amplifier (the main power amplifier) and the bias circuit power amplifier are not limited to be heterojunction bipolar transistors. They may be the form of a bipolar transistor, a field effect transistor or other types of power amplifiers. Furthermore, it is similar to the difference between the embodiments of FIG. 3C and FIG. 3D that in the embodiment of FIG. 4 and FIG. 4A, the emitter electrode 85 and the collector electrode 87 of the heterojunction bipolar transistor 84 are electrically connected with the first metal layer 61 (the first metal layer the first area 611) and the second metal layer 62 (the second metal layer the first area 621) respectively, while in another embodiment (not shown in the Figure) the emitter electrode 85 and the collector electrode 87 of the heterojunction bipolar transistor 84 may be electrically connected with the second metal layer 62 and the first metal layer 61 respectively. Similarly, in the embodiment of FIG. 4 and FIG. 4A, the base electrode 86 of the heterojunction bipolar transistor 84 and the collector electrode 91 of the bias circuit heterojunction bipolar transistor 88 are electrically connected with the first metal layer 61 (the first metal layer the second area 612) and the second metal layer 62 (the second metal layer the second area 622) respectively, while in another embodiment (not shown in the Figure) the base electrode 86 of the heterojunction bipolar transistor 84 and the collector electrode 91 of the bias circuit heterojunction bipolar transistor 88 may be electrically connected with the second metal layer 62 and the first metal layer 61 respectively.

In the embodiment of FIG. 4 and FIG. 4A, since the first metal layer the first area 611 is electrically connected with the emitter electrode 85 of the heterojunction bipolar transistor 84 and the second metal layer the first area 621 is electrically connected with the collector electrode 87 of the heterojunction bipolar transistor 84, hence the impedance of the compound semiconductor integrated circuit 1 at the intersection area the first area 311 and the peripheral adjacent area of the intersection area the first area 311 is an output impedance between the collector electrode 87 and the emitter electrode 85 of the heterojunction bipolar transistor 84. Therefore, to make good use of the feature that the output impedance between the collector electrode 87 and the emitter electrode 85 of the heterojunction bipolar transistor 84 is affected by the first dielectric block the first areas 511 (the thick border frame area), to design and adjust the thickness, area and shape of the first dielectric block the first areas 511 and choose the dielectric constant of the low dielectric material for forming the first dielectric block the first areas 511 in order to form the needed output impedance between the collector electrode 87 and the emitter electrode 85 of the heterojunction bipolar transistor 84, so as to enhance the performance of the compound semiconductor integrated circuit 1.

Hence, the layout method for compound semiconductor integrated circuits of the present invention further comprises following steps of: defining a power amplifier layout area within the compound semiconductor integrated circuit layout area 1; forming a power amplifier within the power amplifier layout area, wherein the power amplifier includes a first terminal, a second terminal and a third terminal; one of the first terminal and the second terminal is an output terminal of the power amplifier; the first terminal is electrically connected with one of the first metal layer 61 and the second metal layer 62 while the second terminal is electrically connected with the other one of the first metal layer 61 and the second metal layer 62, such that the first terminal and the second terminal of the power amplifier are isolated by the first dielectric block 51; and according to the need of an output impedance between the first terminal and the second terminal of the power amplifier near the adjacent crossover area 33, deciding the thickness, the area and the shape of the first dielectric block 51 corresponding to the adjacent crossover area 33, and a dielectric constant of the low dielectric material to form the first dielectric block 51, so as to enhance the performance of the compound semiconductor integrated circuit 1. In one embodiment, the power amplifier is a bipolar transistor or a heterojunction bipolar transistor. The first terminal is a collector electrode, the second terminal is an emitter electrode, and the third terminal is a base electrode. The output impedance is the impedance between the collector electrode and emitter electrode of the power amplifier. In another embodiment, the power amplifier is a field effect transistor. The first terminal is a drain electrode, the second terminal is a source electrode, and the third terminal is a gate electrode. The output impedance is the impedance between the drain electrode and source electrode of the power amplifier.

In the embodiment of FIG. 4 and FIG. 4A, the heterojunction bipolar transistor 84 is a main power amplifier, while the bias circuit heterojunction bipolar transistor 88 is a bias circuit power amplifier. The first metal layer the second area 612 and the second metal layer the second area 622 intersect at an intersection area the second area 312. The two layers having different potentials, first metal layer the second area 612 and the second metal layer the second area 622, form cross-connection by the first dielectric block the second area 512 (the thick border frame area), thereby the first metal layer the second area 612 and the second metal layer the second area 622 are isolated. However the impedance of the compound semiconductor integrated circuit 1 at the intersection area the second area 312 and the peripheral adjacent area of the intersection area the second area 312 is affected by the thickness, area and shape of the first dielectric block the second area 512 and a dielectric constant of a low dielectric material for forming the first dielectric block the second area 512. Since the first metal layer the second area 612 is electrically connected with the base electrode 86 of the heterojunction bipolar transistor 84 and the second metal layer the second area 622 is electrically connected with the collector electrode 91 of the bias circuit heterojunction bipolar transistor 88, hence the impedance of the compound semiconductor integrated circuit 1 at the intersection area the second area 312 and the peripheral adjacent area of the intersection area the second area 312 is the impedance, which is an input impedance of the heterojunction bipolar transistor 84, between the base electrode 86 of the heterojunction bipolar transistor 84 and the collector electrode 91 of the bias circuit heterojunction bipolar transistor 88. Therefore, to make good use of the feature that the input impedance of the heterojunction bipolar transistor 84 is affected by the first dielectric block the second area 512, to design and adjust the thickness, area and shape of the first dielectric block the second area 512 and choose the dielectric constant of the low dielectric material for forming the first dielectric block the second area 512 in order to form the needed input impedance of the heterojunction bipolar transistor 84, so as to enhance the performance of the compound semiconductor integrated circuit 1.

Hence, the layout method for compound semiconductor integrated circuits of the present invention further comprises following steps of: defining a main power amplifier layout area and a bias circuit power amplifier layout area within the compound semiconductor integrated circuit layout area 1; forming a main power amplifier within the main power amplifier layout area, wherein the main power amplifier includes a main power amplifier first terminal, a main power amplifier second terminal and a main power amplifier third terminal; the main power amplifier third terminal is an input terminal of the main power amplifier; forming a bias circuit power amplifier within the bias circuit power amplifier layout area, wherein the bias circuit power amplifier includes a bias circuit power amplifier first terminal, a bias circuit power amplifier second terminal and a bias circuit power amplifier third terminal; the bias circuit power amplifier first terminal is electrically connected with one of the first metal layer 61 and the second metal layer 62 while the main power amplifier third terminal is electrically connected with the other one of the first metal layer 61 and the second metal layer 62, such that the bias circuit power amplifier first terminal and the main power amplifier third terminal are isolated by the first dielectric block 51; and according to the need of an impedance between the bias circuit power amplifier first terminal and the main power amplifier third terminal near the adjacent crossover area 33, deciding the thickness, the area and the shape of the first dielectric block 51 corresponding to the adjacent crossover area 33, and a dielectric constant of the low dielectric material to form the first dielectric block 51, so as to enhance the performance of the compound semiconductor integrated circuit 1, wherein the impedance is an input impedance of the main power amplifier. In one embodiment, the main power amplifier and the bias circuit power amplifier may be a bipolar transistor or a heterojunction bipolar transistor. The main power amplifier first terminal is a main power amplifier collector electrode, the main power amplifier second terminal is a main power amplifier emitter electrode, and the main power amplifier third terminal is a main power amplifier base electrode. The bias circuit power amplifier first terminal is a bias circuit power amplifier collector electrode, the bias circuit power amplifier second terminal is a bias circuit power amplifier emitter electrode, and the bias circuit power amplifier third terminal is a bias circuit power amplifier base electrode. The input impedance is the impedance between the bias circuit power amplifier collector electrode and the main power amplifier base electrode. In another embodiment, the main power amplifier and the bias circuit power amplifier may be a field effect transistor. The main power amplifier first terminal is a main power amplifier drain electrode, the main power amplifier second terminal is a main power amplifier source electrode, and the main power amplifier third terminal is a main power amplifier gate electrode. The bias circuit power amplifier first terminal is a bias circuit power amplifier drain electrode, the bias circuit power amplifier second terminal is a bias circuit power amplifier source electrode, and the bias circuit power amplifier third terminal is a bias circuit power amplifier gate electrode. The input impedance is the impedance between the bias circuit power amplifier drain electrode and the main power amplifier gate electrode.

In the embodiment of FIG. 4 and FIG. 4A, the first metal layer the third area 613 and the second metal layer the second area 622 intersect at an intersection area the third area 313. The two layers having different potentials, first metal layer the third area 613 and the second metal layer the second area 622, form cross-connection by the first dielectric block the third area 513 (the thick border frame area), thereby the first metal layer the third area 613 and the second metal layer the second area 622 are isolated. However the impedance of the compound semiconductor integrated circuit 1 at the intersection area the third area 313 and the peripheral adjacent area of the intersection area the third area 313 is affected by the thickness, area and shape of the first dielectric block the third area 513 and a dielectric constant of a low dielectric material for forming the first dielectric block the third area 513. Since the first metal layer the third area 613 is electrically connected with the base electrode 90 of the bias circuit heterojunction bipolar transistor 88, and the second metal layer the second area 622 is electrically connected with the collector electrode 91 of the bias circuit heterojunction bipolar transistor 88, hence the impedance of the compound semiconductor integrated circuit 1 at the intersection area the third area 313 and the peripheral adjacent area of the intersection area the third area 313 is the impedance, which is an input impedance of the bias circuit heterojunction bipolar transistor 88, between the base electrode 90 and the collector electrode 91 of the bias circuit heterojunction bipolar transistor 88. Therefore, to make good use of the feature that the input impedance of the bias circuit heterojunction bipolar transistor 88 is affected by the first dielectric block the third area 513, to design and adjust the thickness, area and shape of the first dielectric block the third area 513 and choose the dielectric constant of the low dielectric material for forming the first dielectric block the third area 513 in order to form the needed input impedance of the bias circuit heterojunction bipolar transistor 88, so as to enhance the performance of the compound semiconductor integrated circuit 1.

Hence, the layout method for compound semiconductor integrated circuits of the present invention further comprises following steps of: defining a bias circuit power amplifier layout area within the compound semiconductor integrated circuit layout area 1; forming a bias circuit power amplifier within the bias circuit power amplifier layout area, wherein the bias circuit power amplifier includes a bias circuit power amplifier first terminal, a bias circuit power amplifier second terminal and a bias circuit power amplifier third terminal, wherein one of the bias circuit power amplifier first terminal and the bias circuit power amplifier third terminal is an input terminal of the bias circuit power amplifier; the bias circuit power amplifier first terminal is electrically connected with one of the first metal layer 61 and the second metal layer 62 while the bias circuit power amplifier third terminal is electrically connected with the other one of the first metal layer 61 and the second metal layer 62, such that the bias circuit power amplifier first terminal and the bias circuit power amplifier third terminal are isolated by the first dielectric block 51; and according to the need of the input impedance between the bias circuit power amplifier first terminal and the bias circuit power amplifier third terminal near the adjacent crossover area 33, deciding the thickness, the area and the shape of the first dielectric block 51 corresponding to the adjacent crossover area 33, and a dielectric constant of the low dielectric material to form the first dielectric block 51, so as to enhance the performance of the compound semiconductor integrated circuit 1. In one embodiment, the bias circuit power amplifier may be a bipolar transistor or a heterojunction bipolar transistor. The bias circuit power amplifier first terminal is a bias circuit power amplifier collector electrode, the bias circuit power amplifier second terminal is a bias circuit power amplifier emitter electrode, and the bias circuit power amplifier third terminal is a bias circuit power amplifier base electrode. The input impedance is the impedance between the bias circuit power amplifier collector electrode and the bias circuit power amplifier base electrode. In another embodiment, the bias circuit power amplifier may be a field effect transistor. The bias circuit power amplifier first terminal is a bias circuit power amplifier drain electrode, the bias circuit power amplifier second terminal is a bias circuit power amplifier source electrode, and the bias circuit power amplifier third terminal is a bias circuit power amplifier gate electrode. The input impedance is the impedance between the bias circuit power amplifier drain electrode and the bias circuit power amplifier gate electrode.

Figure 4B:
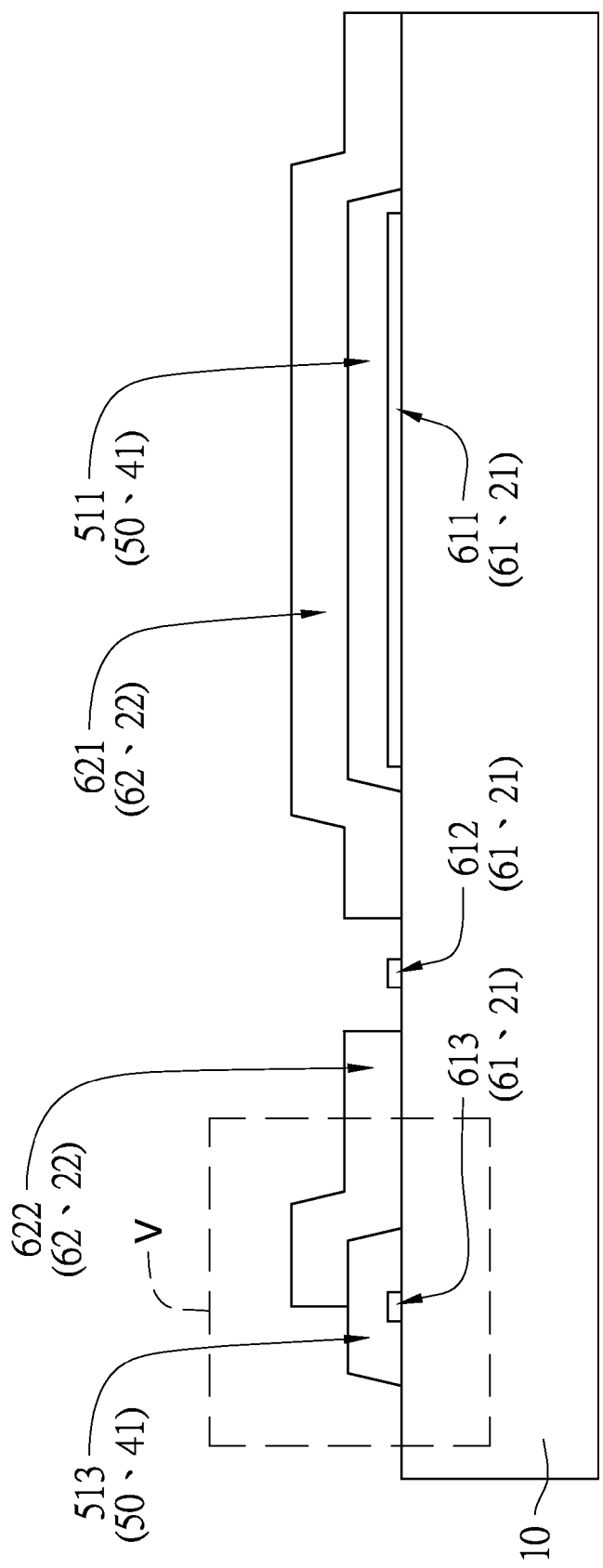
FIG. 4B shows the cross-sectional schematic view along the broken line c-c' in FIG. 4.
Figure 4C:
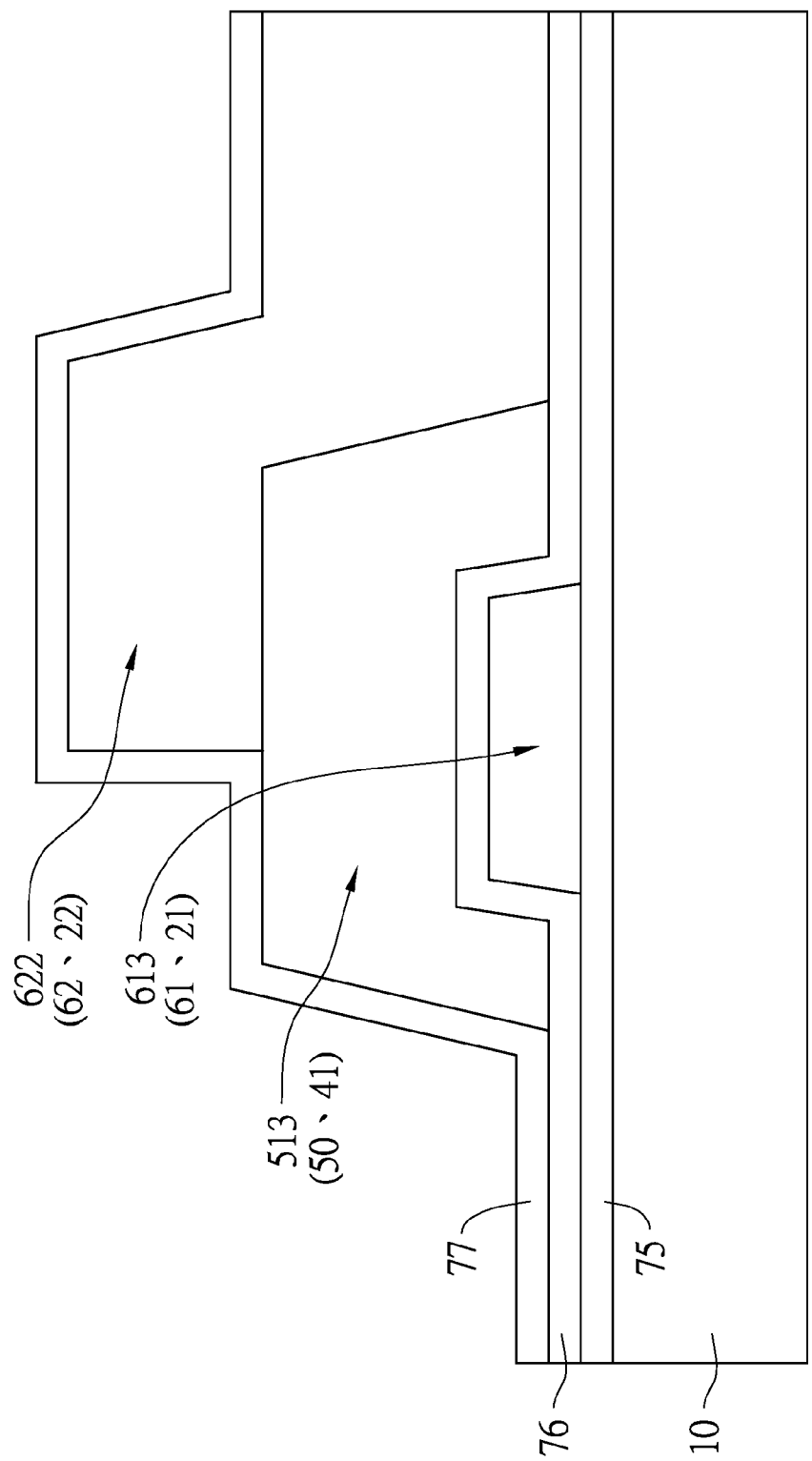
FIG. 4C shows the partial enlargement view of the block V region in FIG. 4B.

Please refer to FIGS. 4, 4A, 4B and 4C. FIG. 4B shows the cross-sectional schematic view along the broken line c-c' in FIG. 4. And FIG. 4C shows the partial enlargement view of the block V region in FIG. 4B. The area around the block V in FIG. 4B is the area near the "c" of the broken line c-c' in FIG. 4 (that is, near the upper area of the broken line c-c'). In FIG. 4B, the first metal layer 61 includes a first metal layer the first area 611, a first metal layer the second area 612 and a first metal layer the third area 613, wherein the first metal layer the first area 611, the first metal layer the second area 612 and the first metal layer the third area 613 are separated and not connected to each other. The second metal layer 62 includes a second metal layer the first area 621 and a second metal layer the second area 622, wherein the second metal layer the first area 621 and the second metal layer the second area 622 are separated and not connected to each other. The two layers having different potentials, first metal layer the first area 611 and the second metal layer the first area 621, form cross-connection by the first dielectric block the first areas 511, thereby the first metal layer the first area 611 and the second metal layer the first area 621 are isolated. The two layers having different potentials, first metal layer the third area 613 and the second metal layer the second area 622, form cross-connection by the first dielectric block the third area 513, thereby the first metal layer the third area 613 and the second metal layer the second area 622 are isolated. In FIG. 4B and FIG. 4C, a lower insulating layer 75 is formed on the compound semiconductor substrate 10; the first metal layer 61 (including the first metal layer the first area 611, the first metal layer the second area 612 and the first metal layer the third area 613) is formed on the lower insulating layer 75; an upper insulating layer 76 is formed on the first metal layer 61 and the compound semiconductor substrate 10; the first dielectric block 51 (including the first dielectric block the first areas 511 and the first dielectric block the third area 513) is formed on the upper insulating layer 76 within the first dielectric area 41; the second metal layer 62 (including the second metal layer the first area 621 and the second metal layer the second area 622) is formed on the first dielectric block 51 and the upper insulating layer 76; and a protection layer 77 is formed on the second metal layer 62, the first dielectric block 51 and the upper insulating layer 76.

The layout method for compound semiconductor integrated circuits of the present invention (referring to the embodiment of FIG. 2), after the step of A5 further comprises a step of forming at least one protection layer 77 on the compound semiconductor integrated circuit 1. In one embodiment, the protection layer 77 is formed on the second metal layer 62. In an embodiment, the protection layer 77 may also be formed on the second dielectric block 52. In another embodiment, the protection layer 77 may also be formed on the first dielectric block 51. In other embodiment, the protection layer 77 may also be formed on the first metal layer 61. In another embodiment, the protection layer 77 may also be formed on the compound semiconductor substrate 10. The protection layer 77 is made of at least one material selected from the group consisting of polybenzoxazole (PBO), SiN and SiO$_2$.

The layout method for compound semiconductor integrated circuits of the present invention (referring to the embodiment of FIG. 2A), after the step of B5 further comprises a step of forming at least one protection layer 77 on the compound semiconductor integrated circuit 1. In one embodiment, the protection layer 77 is formed on the second metal layer 62. In another embodiment, the protection layer 77 may also be formed on the first dielectric block 51. In other embodiment, the protection layer 77 may also be formed on the first metal layer 61. In another embodiment, the protection layer 77 may also be formed on the compound semiconductor substrate 10. The protection layer 77 is made of at least one material selected from the group consisting of polybenzoxazole (PBO), SiN and SiO$_2$.

As disclosed in the above description and attached drawings, the present invention can provide a layout method for compound semiconductor integrated circuits for the application of compound semiconductor integrated circuit and mobile phone circuit. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A layout method for compound semiconductor integrated circuits, comprising following steps of:
   A1: defining a compound semiconductor integrated circuit layout area on a top surface of a compound semiconductor substrate, wherein said compound semiconductor integrated circuit layout area includes a first circuit layout area and a second circuit layout area; said first circuit layout area and said second circuit layout area intersect at an intersection area; an adjacent crossover area is defined to include said intersection area and a peripheral adjacent area of said intersection area;
   A2: defining a first dielectric area on said top surface of said compound semiconductor substrate, wherein said first dielectric area is located within said adjacent crossover area, and said first dielectric area intersects with at least part of said intersection area; a second dielectric area is defined as an area outside said first dielectric area on said top surface of said compound semiconductor substrate;
   A3: forming a first metal layer within said first circuit layout area;
   A4: forming a low dielectric block made of a low dielectric material, wherein said low dielectric block is formed within both said first dielectric area and said second dielectric area, a first dielectric block is defined as said low dielectric block within said first dielectric area, a second dielectric block is defined as said low dielectric block within said second dielectric area; said second dielectric block has a thickness no greater than a thickness of said first dielectric block, and at least part of said second dielectric block has a thickness smaller than said thickness of said first dielectric block; and
   A5: forming a second metal layer within said second circuit layout area;
   wherein forming said first dielectric block further comprises following step of: according to the need of an impedance of said compound semiconductor integrated circuit near said adjacent crossover area, deciding a thickness, an area and a shape of said first dielectric block corresponding to said adjacent crossover area, and deciding a dielectric constant of said low dielectric material to form said first dielectric block, so as to enhance the performance of said compound semiconductor integrated circuit.

2. The layout method for compound semiconductor integrated circuits according to claim 1, wherein said low dielectric material has a water absorption rate lower than 5%.

3. The layout method for compound semiconductor integrated circuits according to claim 1, wherein said low dielectric material is at least one material selected from the group consisting of polybenzoxazole (PBO) and Benzo Cyclobutane (BCB).

4. The layout method for compound semiconductor integrated circuits according to claim 1, wherein said peripheral adjacent area of said intersection area includes an area surrounding said intersection area within a range of 50 μm.

5. The layout method for compound semiconductor integrated circuits according to claim 1, wherein said low dielectric material has a dielectric constant less than 7.

6. The layout method for compound semiconductor integrated circuits according to claim 1, further comprising following steps of:
   defining a main power amplifier layout area and a bias circuit power amplifier layout area within said compound semiconductor integrated circuit layout area;
   forming a main power amplifier within said main power amplifier layout area, wherein said main power amplifier includes a main power amplifier first terminal, a main power amplifier second terminal and a main power amplifier third terminal; said main power amplifier third terminal is an input terminal of said main power amplifier; and
   forming a bias circuit power amplifier within said bias circuit power amplifier layout area, wherein said bias circuit power amplifier includes a bias circuit power amplifier first terminal, a bias circuit power amplifier second terminal and a bias circuit power amplifier third terminal; said bias circuit power amplifier first terminal is electrically connected with one of said first metal layer and said second metal layer while said main power amplifier third terminal is electrically connected with the other one of said first metal layer and said second metal layer, such that said bias circuit power amplifier first terminal and said main power amplifier third terminal are isolated by said first dielectric block;
   wherein said impedance of said compound semiconductor integrated circuit near said adjacent crossover area is an input impedance of said main power amplifier between said bias circuit power amplifier first terminal and said main power amplifier third terminal near said adjacent crossover area.

7. The layout method for compound semiconductor integrated circuits according to claim 6, wherein said main power amplifier and said bias circuit power amplifier are a bipolar transistor or a heterojunction bipolar transistor; said main power amplifier first terminal is a main power amplifier collector electrode, said main power amplifier second terminal is a main power amplifier emitter electrode, said main power amplifier third terminal is a main power amplifier base electrode, said bias circuit power amplifier first terminal is a bias circuit power amplifier collector electrode, said bias circuit power amplifier second terminal is a bias circuit power amplifier emitter electrode, said bias circuit power amplifier third terminal is a bias circuit power amplifier base electrode, wherein said input impedance of said main power amplifier is between said bias circuit power amplifier collector electrode and said main power amplifier base electrode.

8. The layout method for compound semiconductor integrated circuits according to claim 6, wherein said main power amplifier and said bias circuit power amplifier are a field effect transistor; said main power amplifier first terminal is a main power amplifier drain electrode, said main power amplifier second terminal is a main power amplifier source electrode, said main power amplifier third terminal is a main power amplifier gate electrode, said bias circuit power amplifier first terminal is a bias circuit power amplifier drain electrode, said bias circuit power amplifier second terminal is a bias circuit power amplifier source electrode, said bias circuit power amplifier third terminal is a bias circuit power amplifier gate electrode; said input impedance of said main power amplifier is between said bias circuit power amplifier drain electrode and said main power amplifier gate electrode.

9. The layout method for compound semiconductor integrated circuits according to claim 1, between the step of A3 and the step of A4, further comprises a step of forming at least one upper insulating layer; said at least one upper insulating layer is formed on said compound semiconductor substrate and said first metal layer, and said at least one upper insulating layer is formed below said low dielectric block.

10. The layout method for compound semiconductor integrated circuits according to claim 9, wherein said at least one upper insulating layer is made of at least one material selected from the group consisting of SiN and $SiO_2$.

11. The layout method for compound semiconductor integrated circuits according to claim 1, wherein before the step of A3 further comprises a step of forming at least one lower insulating layer; said at least one lower insulating layer is formed on said compound semiconductor substrate, and said at least one lower insulating layer is formed below said first metal layer and said low dielectric block.

12. The layout method for compound semiconductor integrated circuits according to claim 11, wherein said at least one lower insulating layer is made of at least one material selected from the group consisting of SiN and $SiO_2$.

13. The layout method for compound semiconductor integrated circuits according to claim 1, wherein after the step of A5 further comprises a step of forming at least one protection layer on said compound semiconductor integrated circuit.

14. The layout method for compound semiconductor integrated circuits according to claim 13, wherein said at least one protection layer is made of at least one material selected from the group consisting of polybenzoxazole (PBO), SiN and $SiO_2$.

15. A layout method for compound semiconductor integrated circuits, comprising following steps of:
B1: defining a compound semiconductor integrated circuit layout area on a top surface of a compound semiconductor substrate, wherein said compound semiconductor integrated circuit layout area includes a first circuit layout area and a second circuit layout area; said first circuit layout area and said second circuit layout area intersect at an intersection area; an adjacent crossover area is defined to include said intersection area and a peripheral adjacent area of said intersection area;
B2: defining a first dielectric area on said top surface of said compound semiconductor substrate, wherein said first dielectric area is located within said adjacent crossover area, and said first dielectric area intersects with at least part of said intersection area; a second dielectric area is defined as an area outside said first dielectric area on said top surface of said compound semiconductor substrate;
B3: forming a first metal layer within said first circuit layout area;
B4: forming a first dielectric block made of a low dielectric material, wherein said first dielectric block is formed within said first dielectric area and outside of said second dielectric area; and
B5: forming a second metal layer within said second circuit layout area,
wherein forming said first dielectric block further comprises following step of: according to the need of an impedance of said compound semiconductor integrated circuit near said adjacent crossover area, deciding a thickness, an area and a shape of said first dielectric block corresponding to said adjacent crossover area, and deciding a dielectric constant of said low dielectric material to form said first dielectric block, so as to enhance the performance of said compound semiconductor integrated circuit.

16. The layout method for compound semiconductor integrated circuits according to claim 15, wherein said low dielectric material has a water absorption rate lower than 5%.

17. The layout method for compound semiconductor integrated circuits according to claim 15, wherein said low dielectric material is at least one material selected from the group consisting of polybenzoxazole (PBO) and Benzo Cyclobutane (BCB).

18. The layout method for compound semiconductor integrated circuits according to claim 15, wherein in the step of B4, forming said first dielectric block comprises following steps of:
forming a low dielectric block within both said first dielectric area and said second dielectric area; and
removing said low dielectric block within said second dielectric area by using an exposure and development or etching, such that said low dielectric block within said first dielectric area has a thickness equal to a thickness of said first dielectric block, and said low dielectric block within said second dielectric area has a thickness equal to zero.

19. The layout method for compound semiconductor integrated circuits according to claim 15, wherein in the step of B4, forming said first dielectric block comprises following steps of:
forming a low dielectric block within both said first dielectric area and said second dielectric area; and
removing said low dielectric block within both said first dielectric area and said second dielectric area by using an exposure and development or etching, such that said low dielectric block within said first dielectric area has a thickness equal to a thickness of said first dielectric block, and said low dielectric block within said second dielectric area has a thickness equal to zero.

20. The layout method for compound semiconductor integrated circuits according to claim 15, wherein said peripheral adjacent area of said intersection area includes an area surrounding said intersection area within a range of 50 µm.

21. The layout method for compound semiconductor integrated circuits according to claim 15, wherein said low dielectric material has a dielectric constant less than 7.

22. The layout method for compound semiconductor integrated circuits according to claim 15, further comprising following steps of:
defining a main power amplifier layout area and a bias circuit power amplifier layout area within said compound semiconductor integrated circuit layout area;
forming a main power amplifier within said main power amplifier layout area, wherein said main power amplifier includes a main power amplifier first terminal, a main power amplifier second terminal and a main power amplifier third terminal; said main power amplifier third terminal is an input terminal of said main power amplifier; and
forming a bias circuit power amplifier within said bias circuit power amplifier layout area, wherein said bias circuit power amplifier includes a bias circuit power amplifier first terminal, a bias circuit power amplifier second terminal and a bias circuit power amplifier third terminal; said bias circuit power amplifier first terminal is electrically connected with one of said first metal layer and said second metal layer while said main power amplifier third terminal is electrically connected with the other one of said first metal layer and said second metal layer, such that said bias circuit power amplifier first terminal and said main power amplifier third terminal are isolated by said first dielectric block;
wherein said impedance of said compound semiconductor integrated circuit near said adjacent crossover area is an input impedance of said main power amplifier between said bias circuit power amplifier first terminal and said main power amplifier third terminal near said adjacent crossover area.

23. The layout method for compound semiconductor integrated circuits according to claim 22, wherein said main power amplifier and said bias circuit power amplifier are a bipolar transistor or a heterojunction bipolar transistor; said main power amplifier first terminal is a main power amplifier collector electrode, said main power amplifier second terminal is a main power amplifier emitter electrode, said main power amplifier third terminal is a main power amplifier base electrode, said bias circuit power amplifier first terminal is a bias circuit power amplifier collector electrode, said bias circuit power amplifier second terminal is a bias circuit power amplifier emitter electrode, said bias circuit power amplifier third terminal is a bias circuit power amplifier base electrode; said input impedance of said main power amplifier is between said bias circuit power amplifier collector electrode and said main power amplifier base electrode.

24. The layout method for compound semiconductor integrated circuits according to claim 22, wherein said main power amplifier and said bias circuit power amplifier are a field effect transistor; said main power amplifier first terminal is a main power amplifier drain electrode, said main power amplifier second terminal is a main power amplifier source electrode, said main power amplifier third terminal is a main power amplifier gate electrode, said bias circuit power amplifier first terminal is a bias circuit power amplifier drain electrode, said bias circuit power amplifier second terminal is a bias circuit power amplifier source electrode, said bias circuit power amplifier third terminal is a bias circuit power amplifier gate electrode; said input impedance of said main power amplifier is between said bias circuit power amplifier drain electrode and said main power amplifier gate electrode.

25. The layout method for compound semiconductor integrated circuits according to claim 15, between the step of B3 and the step of B4, further comprises a step of forming at least one upper insulating layer; said at least one upper insulating layer is formed on said compound semiconductor substrate and said first metal layer, and said at least one upper insulating layer is formed below said first dielectric block.

26. The layout method for compound semiconductor integrated circuits according to claim 25, wherein said at least one upper insulating layer is made of at least one material selected from the group consisting of SiN and $SiO_2$.

27. The layout method for compound semiconductor integrated circuits according to claim 15, wherein before the step of B3 further comprises a step of forming at least one lower insulating layer; said at least one lower insulating layer is formed on said compound semiconductor substrate, and said at least one lower insulating layer is formed below said first metal layer and said first dielectric block.

28. The layout method for compound semiconductor integrated circuits according to claim 27, wherein said at least one lower insulating layer is made of at least one material selected from the group consisting of SiN and $SiO_2$.

29. The layout method for compound semiconductor integrated circuits according to claim 15, wherein after the step of B5 further comprises a step of forming at least one protection layer on said compound semiconductor integrated circuit.

30. The layout method for compound semiconductor integrated circuits according to claim 29, wherein said at least one protection layer is made of at least one material selected from the group consisting of polybenzoxazole (PBO), SiN and $SiO_2$.

* * * * *